(12) United States Patent
Matsugu et al.

(10) Patent No.: US 12,403,507 B2
(45) Date of Patent: Sep. 2, 2025

(54) TRANSFER APPARATUS, CLEANING MODULE, AND SUBSTRATE PROCESSING APPARATUS

(71) Applicant: EBARA CORPORATION, Tokyo (JP)

(72) Inventors: Asagi Matsugu, Tokyo (JP); Akihiro Yazawa, Tokyo (JP); Manato Furusawa, Tokyo (JP); Hideharu Aoyama, Tokyo (JP); Ayumu Saito, Tokyo (JP); Yusuke Sasaya, Tokyo (JP); Kenichi Kobayashi, Tokyo (JP); Yasuyuki Miyasawa, Tokyo (JP); Tsuyoshi Soma, Tokyo (JP); Keiichi Nojo, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 282 days.

(21) Appl. No.: 18/036,342

(22) PCT Filed: Oct. 25, 2021

(86) PCT No.: PCT/JP2021/039244
§ 371 (c)(1),
(2) Date: Sep. 27, 2023

(87) PCT Pub. No.: WO2022/102386
PCT Pub. Date: May 19, 2022

(65) Prior Publication Data
US 2024/0001407 A1    Jan. 4, 2024

(30) Foreign Application Priority Data

Nov. 11, 2020 (JP) ................................ 2020-187971
Dec. 25, 2020 (JP) ................................ 2020-216935

(51) Int. Cl.
*B08B 1/20* (2024.01)
*B08B 3/12* (2006.01)
*B24B 37/34* (2012.01)

(52) U.S. Cl.
CPC .................. *B08B 1/20* (2024.01); *B08B 3/12* (2013.01); *B24B 37/34* (2013.01)

(58) Field of Classification Search
CPC ........................................................ B08B 1/20
See application file for complete search history.

(56) References Cited

U.S. PATENT DOCUMENTS 8,795,032 B2    8/2014  Miyazaki et al.
2022/0005716 A1 1/2022  Yazawa et al.

FOREIGN PATENT DOCUMENTS

CN      110757316 A    2/2020
JP      2003-104544 A  4/2003
(Continued)

OTHER PUBLICATIONS

International Patent Application No. PCT/JP2021/039244; Int'l Search Report dated Dec. 21, 2021; 2 pages.

*Primary Examiner* — Jason Y Ko
(74) *Attorney, Agent, or Firm* — BakerHostetler

(57) ABSTRACT

To achieve a cleaning module and a substrate processing apparatus that can improve the cleaning capability for a substrate with a simple structure.
A cleaning module includes a first transfer mechanism 210-1, an ultrasonic cleaning tank 440, a transfer machine 420, and a second transfer mechanism 210-2. The first transfer mechanism 210-1 is for transferring a substrate WF with a surface to be polished facing downward up to a substrate grip or release position 418 on a downstream side along a transfer passage 405. The ultrasonic cleaning tank 440 is disposed at a position spaced apart from the transfer passage 405 and is for cleaning a substrate WF with the (Continued)

surface to be polished facing downward. The transfer machine 420 is for transferring the substrate WF between the substrate grip or release position 418 of the transfer passage 405 and the ultrasonic cleaning tank 440. The second transfer mechanism 210-2 is for transferring the substrate WF transferred to the substrate grip or release position 418 from the ultrasonic cleaning tank 440 by the transfer machine 420 to further downstream along the transfer passage 405.

10 Claims, 28 Drawing Sheets

(56) References Cited

FOREIGN PATENT DOCUMENTS

| JP | 2019-036573 A | 3/2019 |
|----|---------------|--------|
| JP | 2020-009987 A | 1/2020 |
| JP | 2020-053421 A | 4/2020 |

Fig. 11
(A)
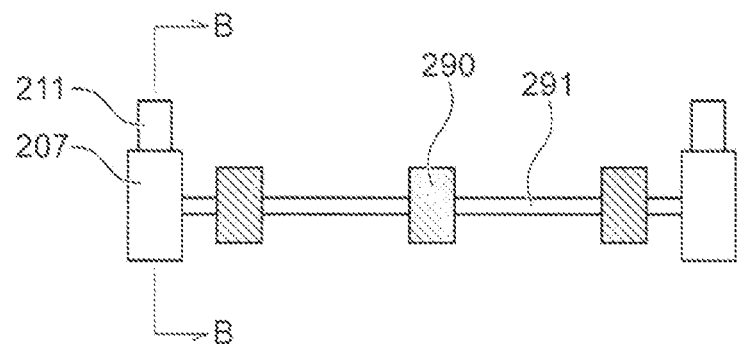
(B)
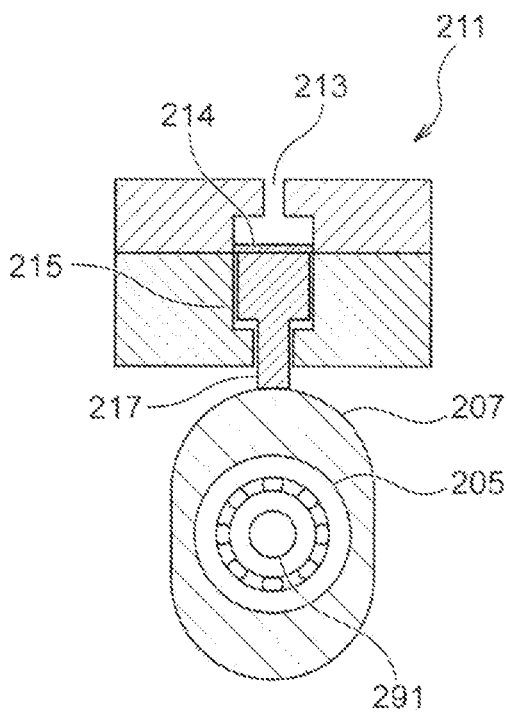

TRANSFER APPARATUS, CLEANING MODULE, AND SUBSTRATE PROCESSING APPARATUS

TECHNICAL FIELD

This application relates to a transfer machine, a cleaning module, and a substrate processing apparatus. This application claims the priority based on Japanese Patent Application No. 2020-187971, filed on Nov. 11, 2020, and Japanese Patent Application No. 2020-216935, filed on Dec. 25, 2020. The entire disclosure including the descriptions, the claims, the drawings, and the abstracts in Japanese Patent Application No. 2020-187971 and Japanese Patent Application No. 2020-216935 are herein incorporated by reference.

BACKGROUND ART

In production of a semiconductor device, a substrate processing apparatus is used for planarizing a surface of a substrate. The substrate used in the production of the semiconductor device has a circular-plate shape in many cases. There is a growing demand for flatness not only for the semiconductor device, but also for a quadrangle substrate, such as a Copper Clad Laminate substrate (CCL substrate), a Printed Circuit Board (PCB) substrate, a photomask substrate, and a display panel, to have the surface planarized.

For example, PTL 1 discloses a substrate processing apparatus in which polishing processing is performed with a surface to be polished of a substrate facing downward, cleaning is performed by injecting a cleaning liquid onto both surfaces of the substrate being transferred along a transfer passage after the polishing, and the substrate being transferred along a transfer passage after cleaning is dried. However, residue such as slurry generated by polishing sometimes adheres to the substrate that has undergone the polishing processing and it is not likely that the residue is not sufficiently removed simply by injecting the cleaning liquid onto both surfaces of the substrate. In this respect, for example, PTL 2 discloses that the substrate is cleaned by immersing the substrate in a cleaning liquid in a vertical posture and irradiating both surfaces of the substrate with ultrasonic waves.

CITATION LIST

Patent Literature

PTL 1: Japanese Unexamined Patent Application Publication No. 2020-9987
PTL 2: Japanese Unexamined Patent Application Publication No. 2003-104544

SUMMARY OF INVENTION

Technical Problem

Simply injecting a cleaning liquid onto both surfaces of a substrate being transferred by a roller conveyor as described in PTL 1 cannot sufficiently remove stain adhering to the substrate, in some cases.

In contrast, it is conceivable to additionally dispose a cleaning tank for cleaning the substrate, transfer the substrate from the roller conveyor to the cleaning tank using a transfer machine, and immerse the substrate into the cleaning tank to clean it. In this case, it is conceivable to dispose a guide roller that is brought into contact with an upper surface of the substrate to guide the substrate such that the substrate being transferred by the roller conveyor is stably housed in a housing space of the transfer machine. However, in a case where the upper surface of the substrate is guided by the guide roller, it is likely that a left-uncleaned part is generated in a portion with which the guide roller is brought into contact when the transfer machine and the substrate are immersed into the cleaning tank to be cleaned.

Accordingly, it is one of the objects of this application to achieve a transfer machine that can stably guide a substrate to a housing space and suppress generation of a left-uncleaned part.

For example, since the prior art disclosed in PTL 1 is not likely to sufficiently remove the residue adhering to a substrate, it is conceivable to combine the substrate cleaning technique described in PTL 2 for improving cleaning capability for a substrate. However, it is not preferred because a structure of a whole apparatus becomes complicated.

That is, the polishing processing of the substrate is generally performed with the surface to be polished of the substrate facing downward as described in PTL 1, or with the surface to be polished of the substrate facing upward. Accordingly, since the substrate after the polishing processing is set in a horizontal posture, when the substrate is immersed in the cleaning liquid to undergo ultrasonic cleaning in the vertical posture as described in PTL 2, a mechanism for setting the substrate in the vertical posture is required, and thus, a structure of a whole apparatus is complicated. In addition, when the substrate undergoes the ultrasonic cleaning in the vertical posture, even when the residue adhering to an upper portion of the substrate is removed by the ultrasonic wave, it is also likely that it sinks downward in the cleaning liquid and re-adheres to a lower portion of the substrate.

Therefore, it is one of the objects of this application to achieve a cleaning module and a substrate processing apparatus that can improve the cleaning capability for a substrate with a simple structure.

Solution to Problem

According to one embodiment, a cleaning module is disclosed. The cleaning module includes a first transfer mechanism, a cleaning tank, a transfer machine, and a second transfer mechanism. The first transfer mechanism is for transferring a substrate with a surface to be polished facing downward up to a substrate grip or release position on a downstream side along a transfer passage. The cleaning tank is disposed at a position spaced apart from the transfer passage. The cleaning tank is for cleaning a substrate with the surface to be polished facing downward. The transfer machine is for transferring the substrate between the substrate grip or release position of the transfer passage and the cleaning tank. The second transfer mechanism is for transferring the substrate transferred to the substrate grip or release position from the cleaning tank by the transfer machine to further downstream along the transfer passage.

This application discloses a transfer machine for transferring a substrate between a grip or release position in a transfer passage of the substrate and a cleaning tank disposed at a position spaced apart from the transfer passage as one embodiment. The transfer machine includes a guide roller and a guide release mechanism. The guide roller is configured to be brought into contact with an upper surface of the substrate transferred to the grip or release position and guide the substrate. The guide release mechanism is configured to separate the guide roller from the substrate after the substrate has been transferred up to the grip or release position.

BRIEF DESCRIPTION OF DRAWINGS

FIG. 11A and FIG. 11B are side views schematically illustrating a pressing mechanism according to the one embodiment.

DESCRIPTION OF EMBODIMENTS

Figure 1:
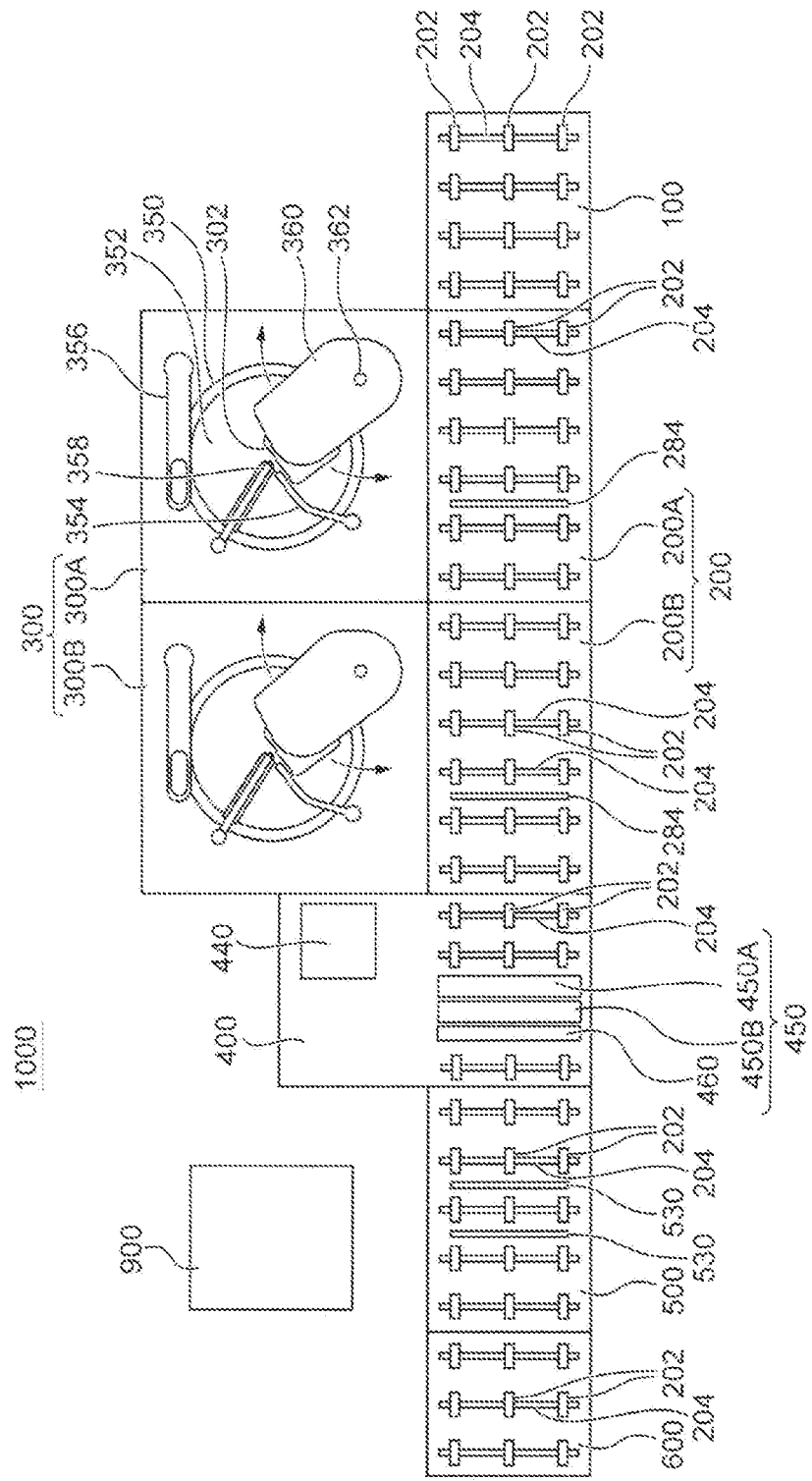
FIG. 1 is a plan view illustrating an overall configuration of a substrate processing apparatus according to one embodiment.

The following describes embodiments of a cleaning module and a substrate processing apparatus according to the present invention with the attached drawings. In the attached drawings, identical or similar reference numerals are given to identical or similar components, and duplicate explanations regarding to the identical or similar components will be omitted in the description of each embodiment, in some cases. Features indicated in each embodiment are applicable to other embodiments as long as they do not conflict with one another.

FIG. 1 is a plan view illustrating an overall configuration of a substrate processing apparatus 1000 according to one embodiment. The substrate processing apparatus 1000 illustrated in FIG. 1 includes a load module 100, a transfer module 200, a polishing module 300, a cleaning module 400, a drying module 500, and an unload module 600. In the illustrated embodiment, the transfer module 200 includes two transfer modules 200A, 200B, and the polishing module 300 includes two polishing modules 300A, 300B. In one embodiment, each of these modules can be independently formed. By independently forming these modules and conveniently combining the numbers of the respective modules, the substrate processing apparatus 1000 having different configurations can be easily formed. The substrate processing apparatus 1000 includes a control device 900, and each component of the substrate processing apparatus 1000 is controlled by the control device 900. In one embodiment, the control device 900 can be constituted of a general computer including an input/output device, an arithmetic device, a storage device, and the like.

<Load Module>

The load module 100 is a module for introducing a substrate WF before processing such as polishing and cleaning is performed into the substrate processing apparatus 1000. In one embodiment, the load module 100 is configured to comply with Mechanical Equipment Interface Standard (IPC-SMEMA-9851) of Surface Mount Equipment Manufacturers Association (SMEMA).

In the illustrated embodiment, a transfer mechanism of the load module 100 includes a plurality of transfer rollers 202 (first transfer rollers) and a plurality of roller shafts 204 to which the transfer rollers 202 are mounted. In the embodiment illustrated in FIG. 1, three transfer rollers 202 are mounted to each roller shaft 204. The substrate WF is disposed on the transfer rollers 202 and is transferred by the rotating transfer rollers 202. Mounting positions of the transfer rollers 202 on the roller shafts 204 can be conveniently set as long as they are positions where the substrate WF can be stably transferred. However, since the transfer rollers 202 are brought into contact with the substrate WF, the transfer rollers 202 should be disposed such that the transfer rollers 202 are brought into contact with the substrate WF to be processed in a region where there is no problem even when the transfer rollers 202 are brought into contact with it. In one embodiment, the transfer roller 202 of the load module 100 can be constituted of a conductive polymer. In one embodiment, the transfer rollers 202 are electrically grounded via the roller shafts 204 and the like.

This is for preventing the substrate WF from being electrically charged and thus preventing electronic devices and the like on the substrate WF from being damaged. In one embodiment, an ionizer (not illustrated) may be disposed in the load module 100 for preventing the substrate WF from being electrically charged.

<Transfer Module>

The substrate processing apparatus 1000 illustrated in FIG. 1 includes the two transfer modules 200A, 200B. Since the two transfer modules 200A, 200B can have the same configuration, they will be collectively described below as the transfer module 200.

Figure 2:
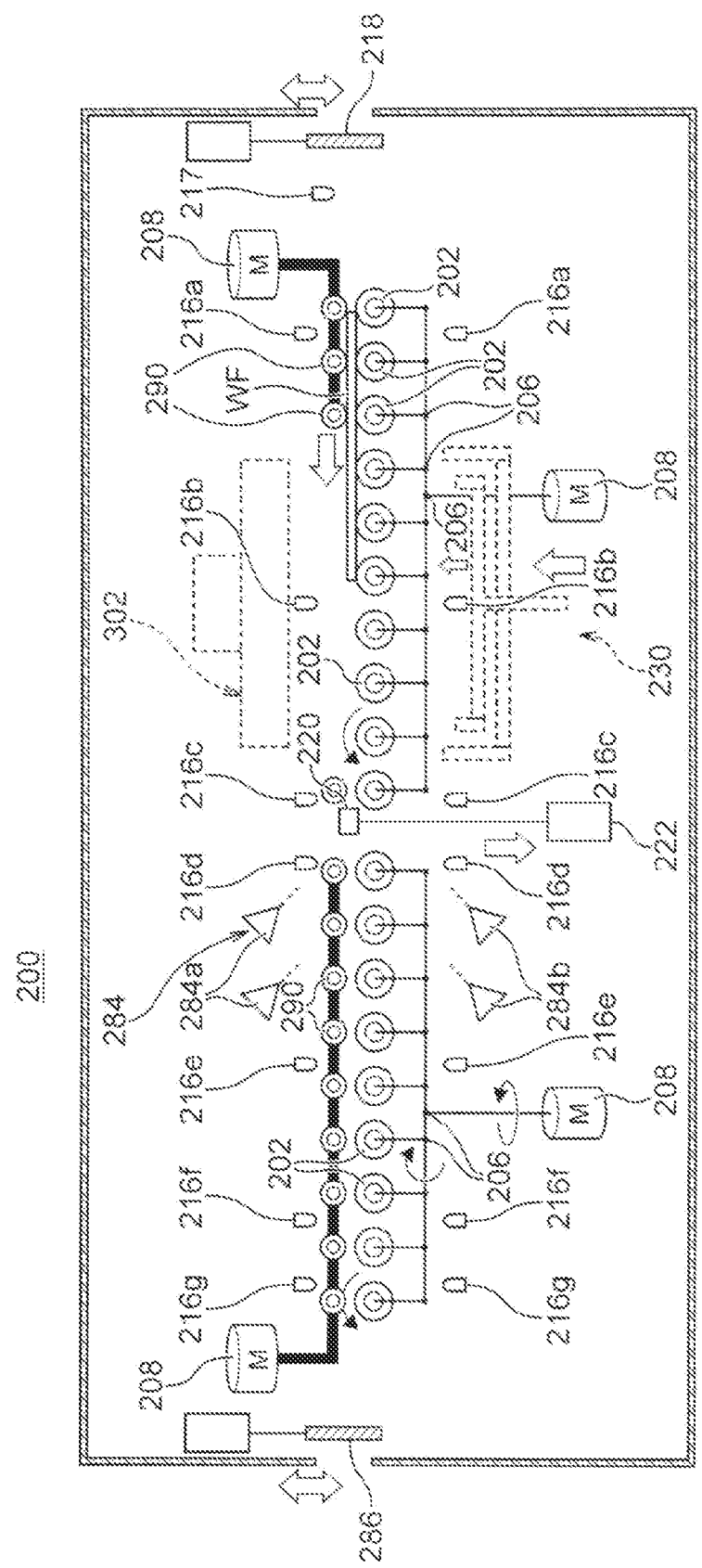
FIG. 2 is a side view schematically illustrating a transfer module according to the one embodiment.
Figure 3:
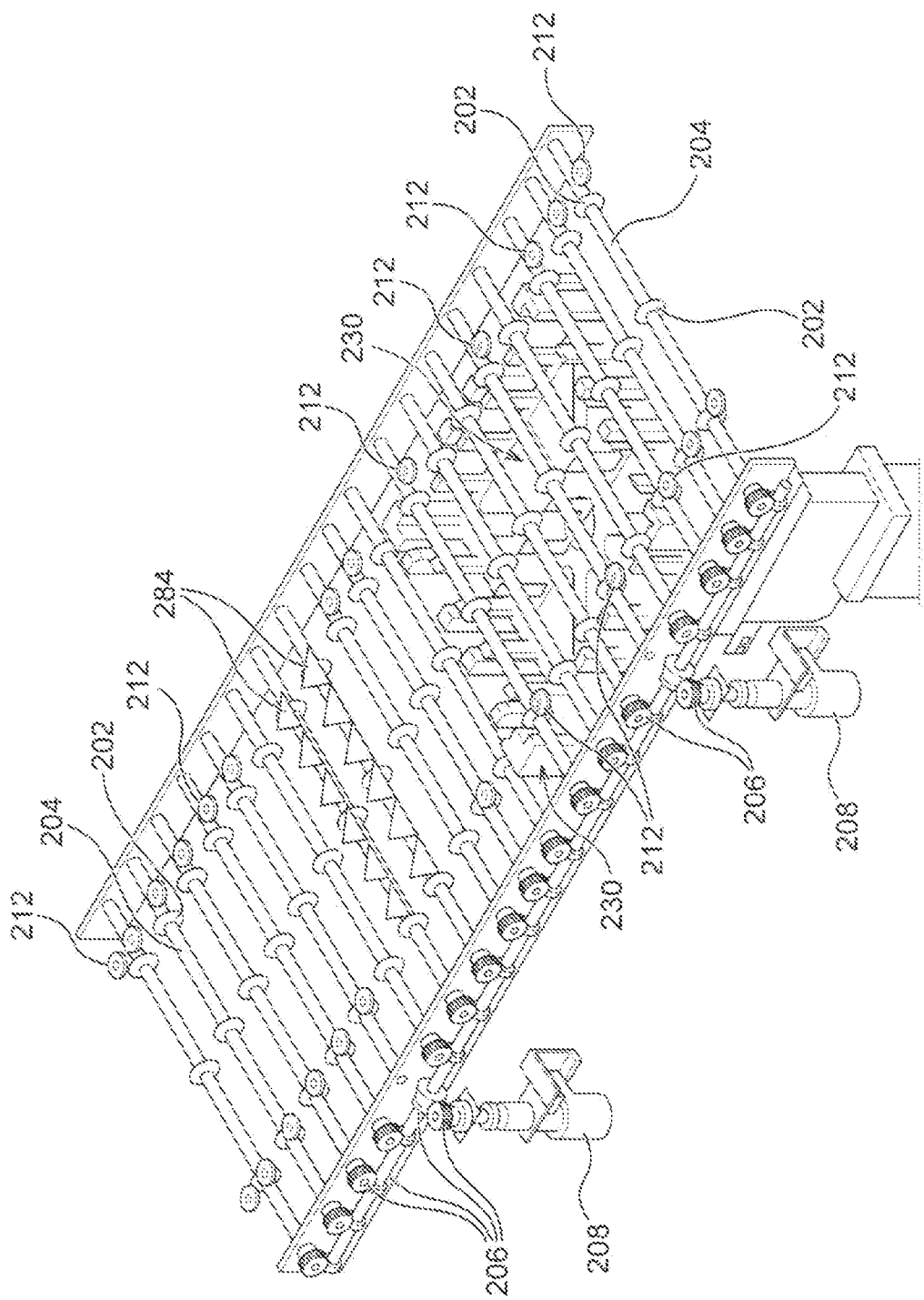
FIG. 3 is a perspective view illustrating the transfer module according to the one embodiment.

FIG. 2 is a side view schematically illustrating the transfer module 200 according to the one embodiment. FIG. 3 is a perspective view schematically illustrating the transfer module 200 according to the one embodiment. In FIG. 3, for clarification of illustration, upper transfer rollers (second transfer rollers) 290 and their driving mechanism, which will be described later, are omitted. The illustrated transfer module 200 includes the plurality of transfer rollers (first transfer rollers) 202 for transferring the substrate WF. By rotating the transfer rollers 202, the substrate WF on the transfer rollers 202 can be transferred in a predetermined direction. The transfer roller 202 of the transfer module 200 may be formed of a conductive polymer or may be formed of a non-conductive polymer. The transfer rollers 202 are mounted to the roller shafts (the first roller shafts) 204 and are driven by a motor 208 via a gear 206. In one embodiment, the motor 208 can be a servo motor, and the gear 206 can be a gear type, but can also be a magnet gear. The illustrated transfer module 200 includes guide rollers 212 that support side surfaces of the substrate WF during transfer.

As illustrated in FIG. 2 and FIG. 3, the transfer module 200 includes a pusher 230. The pusher 230 is configured to be able to lift the substrate WF on the plurality of transfer rollers 202 so as to separate the substrate WF from the plurality of transfer rollers 202. The pusher 230 is configured to be able to grip or release the held substrate WF to the transfer rollers 202 of the transfer module 200.

As illustrated in FIG. 2, the transfer module 200 includes a stopper 220. The stopper 220 is connected to a stopper moving mechanism 222 and can enter into a transfer passage of the substrate WF moving on the transfer rollers 202. When the stopper 220 is positioned inside the transfer passage of the substrate WF, the side surface of the substrate WF moving on the transfer rollers 202 is brought into contact with the stopper 220 and the stopper 220 can stop the moving substrate WF at a position of the stopper 220. When the stopper 220 is at a position where it retracts from the transfer passage of the substrate WF, the substrate WF can move on the transfer rollers 202. The stop position of the substrate WF by the stopper 220 is a position (a grip or release position) where the pusher 230 can receive the substrate WF on the transfer rollers 202.

The transfer module 200 of this embodiment includes a sensor 216 for detecting presence/absence of the substrate WF at a predetermined position on the transfer rollers 202. The sensor 216 can be any type of sensor, for example, an optical sensor. In the embodiment illustrated in FIG. 2, the seven sensors 216 (216a to 216g) are disposed in the transfer module 200. In one embodiment, an operation of the transfer module 200 can be controlled according to detection of the substrate WF by these sensors 216a to 216g. As illustrated in FIG. 2, the transfer module 200 includes an inlet shutter 218 openable/closable for receiving the substrate WF inside the transfer module 200.

The sensor 216a is disposed on an inlet side of the transfer module 200. When the sensor 216a confirms that a rear portion of the substrate WF has passed, the inlet shutter 218 can be closed. Then, the substrate WF is transferred by the transfer rollers 202 while the position of the substrate WF is monitored by the sensor 216b disposed on a downstream side of the sensor 216a. At this time, the stopper 220 is moved into the transfer passage of the substrate WF by the stopper moving mechanism 222. The substrate WF that has been transferred on the transfer rollers 202 is bought into contact with the stopper 220 to be stopped. The sensor 216c is disposed at the position of the stopper 220, and when the sensor 216c detects the substrate WF, the operation of the transfer roller 202 is stopped. The substrate WF that has stopped at the position (grip or release position) of the stopper 220 is gripped or released to a top ring 302 of the polishing module 300 via the pusher 230.

The transfer module 200 illustrated in FIG. 2 and FIG. 3 includes a cleaning mechanism. As illustrated in FIG. 2 and FIG. 3, the cleaning mechanism includes a cleaning nozzle 284. The cleaning nozzle 284 includes an upper cleaning nozzle 284a disposed above the transfer rollers 202 and a lower cleaning nozzle 284b disposed below the transfer rollers 202. The upper cleaning nozzle 284a and the lower cleaning nozzle 284b are connected to a supply source of the cleaning liquid (not illustrated). The upper cleaning nozzle 284a is configured to supply the cleaning liquid to an upper surface of the substrate WF transferred on the transfer rollers 202. The lower cleaning nozzle 284b is configured to supply the cleaning liquid to a lower surface of the substrate WF transferred on the transfer rollers 202. The upper cleaning nozzle 284a and the lower cleaning nozzle 284b are configured to have widths approximately equal to or greater than a width of the substrate WF transferred on the transfer rollers 202 to clean the whole surfaces of the substrate WF by the substrate WF being transferred on the transfer rollers 202. As illustrated in FIG. 2 and FIG. 3, the cleaning mechanism is positioned downstream with respect to the substrate grip or release region of the transfer module 200.

As illustrated in FIG. 2, in a region where the grip or release of the substrate WF by the pusher 230 is not performed, upper transfer rollers 290 are disposed above the transfer rollers 202. The upper transfer rollers 290 are connected to a power source and are configured to be rotatable. In the one embodiment, the upper transfer rollers 290 are configured to be driven by the gear 206 and the motor 208 similarly to the transfer rollers 202.

<Polishing Module>

Figure 4:
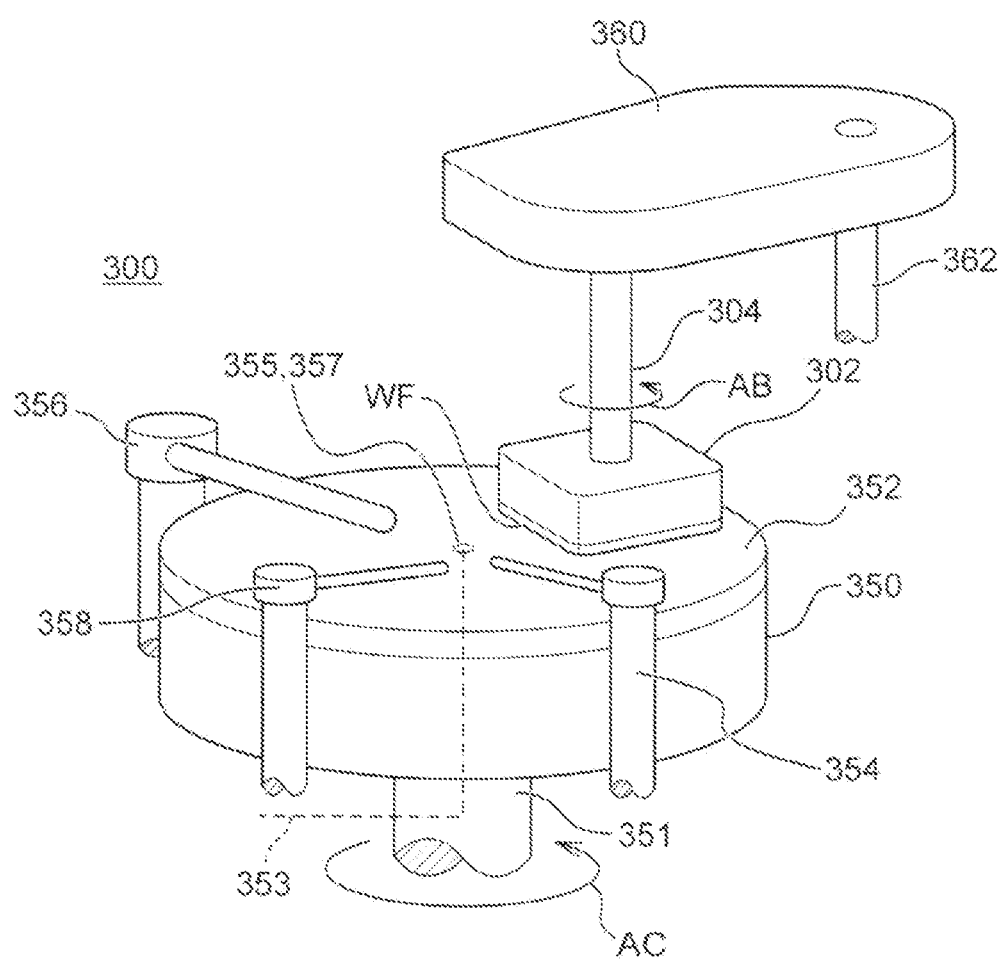
FIG. 4 is a perspective view schematically illustrating a polishing module according to the one embodiment.

FIG. 4 is a perspective view schematically illustrating the polishing module 300 according to the one embodiment. The substrate processing apparatus 1000 illustrated in FIG. 1 includes the two polishing modules 300A, 300B. Since the two polishing modules 300A, 300B can have the same configuration, they will be collectively described below as the polishing module 300.

As illustrated in FIG. 4, the polishing module 300 includes a polishing table 350 and the top ring 302. The polishing table 350 is supported by a table shaft 351. By a driver (not illustrated), the polishing table 350 is rotated around a shaft center of the table shaft 351 as indicated by an arrow AC. A polishing pad 352 is attached to the polishing table 350. The top ring 302 holds the substrate WF and presses it against the polishing pad 352. The top ring 302 is rotatably driven by a driving source (not illustrated). The substrate WF is polished by being held and pressed against the polishing pad 352 by the top ring 302.

As illustrated in FIG. 4, the polishing module 300 includes a polishing liquid supply nozzle 354 for supplying a polishing liquid or a dressing liquid to the polishing pad 352. The polishing liquid is, for example, slurry. The dressing liquid is, for example, pure water. As illustrated in FIG. 4, a passage 353 for supplying the polishing liquid is disposed through the polishing table 350 and the table shaft 351. The passage 353 communicates with an opening portion 355 on a surface of the polishing table 350. The polishing pad 352 has a through-hole 357 at a position corresponding to the opening portion 355 of the polishing table 350, and the polishing liquid passing through the passage 353 is supplied onto a surface of the polishing pad 352 from the opening portion 355 of the polishing table 350 and the through-hole 357 of the polishing pad 352. The polishing module 300 includes a dresser 356 for performing conditioning of the polishing pad 352. The polishing module 300 includes an atomizer 358 for injecting a liquid or a mixture fluid of the liquid and a gas toward the polishing pad 352. The liquid injected from the atomizer 358 is, for example, pure water, and the gas is, for example, nitrogen gas.

The top ring 302 is supported by a top ring shaft 304. The top ring 302 rotates around a shaft center of the top ring shaft 304 as indicated by an arrow AB, by a driver (not illustrated). The top ring shaft 304 can move in an up-down direction by a driving mechanism (not illustrated).

The substrate WF is held on a surface opposed to the polishing pad 352 of the top ring 302 by vacuum suction. During polishing, the polishing liquid is supplied to a polishing surface of the polishing pad 352 from the polishing liquid supply nozzle 354 and/or the through-hole 357 of the polishing pad 352. During polishing, the polishing table 350 and the top ring 302 are rotatably driven. The substrate WF is polished by being pressed against the polishing surface of the polishing pad 352 by the top ring 302.

As illustrated in FIG. 4, the top ring shaft 304 is coupled to an arm 360, and the arm 360 is swingable around a rotation shaft 362. During polishing the substrate WF, the arm 360 may be fixed or swinged such that the top ring 302 passes through a center of the polishing pad 352. During polishing of the substrate WF, the arm 360 may be swinged or fixed such that the substrate WF covers the through-hole 357 of the polishing pad 352. As illustrated in FIG. 1, by the swingable arm 360, the top ring 302 can move toward the transfer module 200. By moving to the substrate grip or release position of the transfer module 200, the top ring 302 can receive the substrate WF from the pusher 230. After the polishing of the substrate WF in the polishing module 300, the substrate WF can be gripped or released to the pusher 230 from the top ring 302.

<Cleaning Module>

Figure 5:
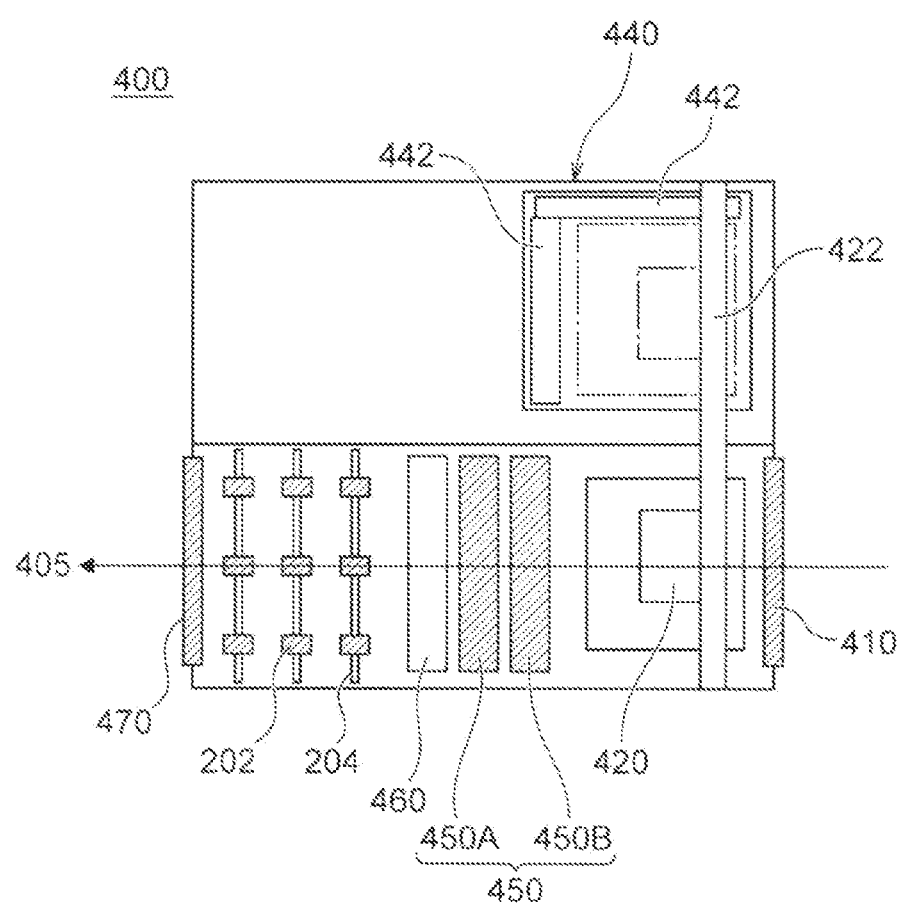
FIG. 5 is a plan view schematically illustrating a cleaning module according to the one embodiment.
Figure 6:
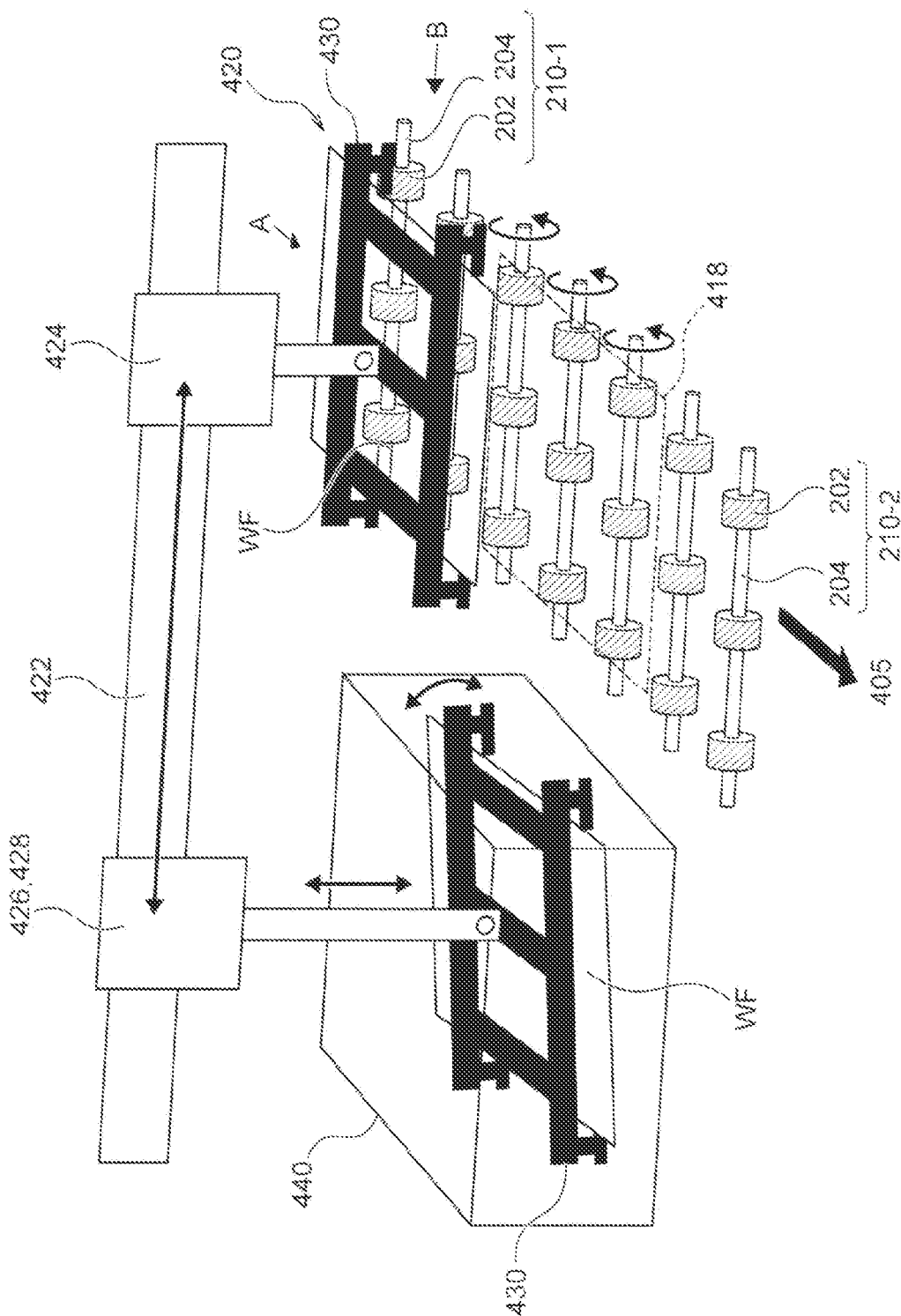
FIG. 6 is a perspective view schematically illustrating the cleaning module according to the one embodiment.

The substrate processing apparatus 1000 of this embodiment includes the cleaning module 400 for removing residue such as slurry that cannot be completely cleaned by the cleaning mechanism (the upper cleaning nozzle 284a and the lower cleaning nozzle 284b) of the transfer module 200 from the substrate WF. FIG. 5 is a plan view schematically illustrating the cleaning module according to the one embodiment. FIG. 6 is a perspective view illustrating the cleaning module according to the one embodiment.

As illustrated in FIG. 5, the substrate WF polished by the polishing module 300 is loaded into the cleaning module 400 with the surface to be polished facing downward through an inlet shutter 410. As illustrated in FIG. 6, the cleaning module 400 includes a first transfer mechanism 210-1 for transferring the substrate WF with the surface to be polished facing downward to a substrate grip or release position 418 on the downstream side along a transfer passage 405 having a linear shape. The cleaning module 400 includes an ultrasonic cleaning tank 440 disposed at a position spaced apart from the transfer passage 405 in a direction perpendicular to the transfer passage 405. The ultrasonic cleaning tank 440 is a cleaning tank for cleaning the substrate WF with the surface to be polished facing downward. The cleaning module 400 includes a transfer machine 420 for transferring the substrate WF between the substrate grip or release position 418 in the transfer passage 405 and the ultrasonic cleaning tank 440. The cleaning module 400 includes a second transfer mechanism 210-2 for transferring the substrate WF transferred from the ultrasonic cleaning tank 440 to the substrate grip or release position 418 by the transfer machine 420 further to the downstream side along the transfer passage 405. In a region where the grip or release of the substrate WF by the transfer machine 420 is not performed, while the upper transfer rollers 290 are disposed above the transfer rollers 202, for clarification of illustration, the upper transfer rollers 290 and their driving mechanism are omitted in FIG. 5 and FIG. 6.

Figure 7:
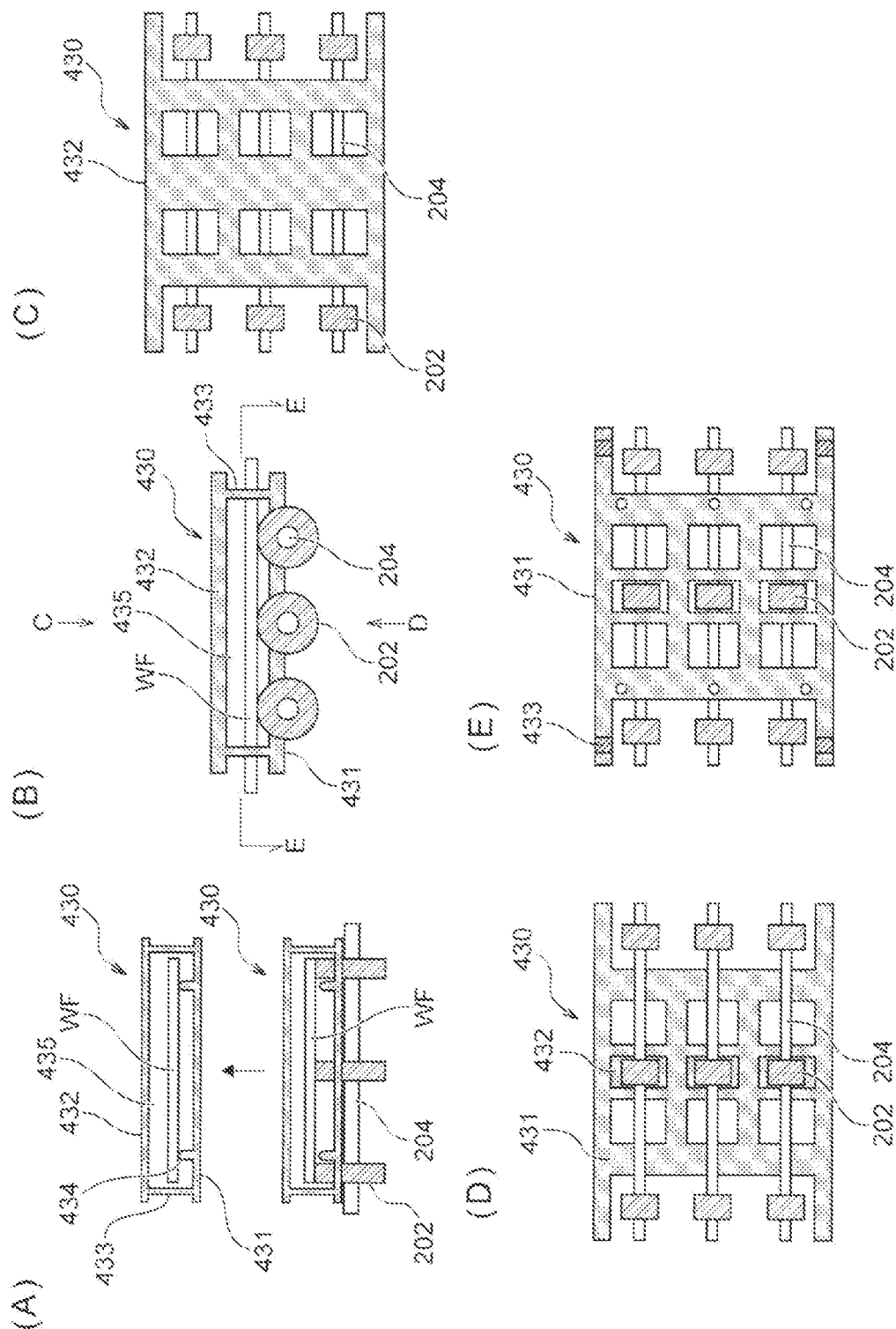
FIG. 7A to FIG. 7E include side views, plan views, and a cross-sectional view each schematically illustrating a transfer machine according to the one embodiment.
Figure 8:
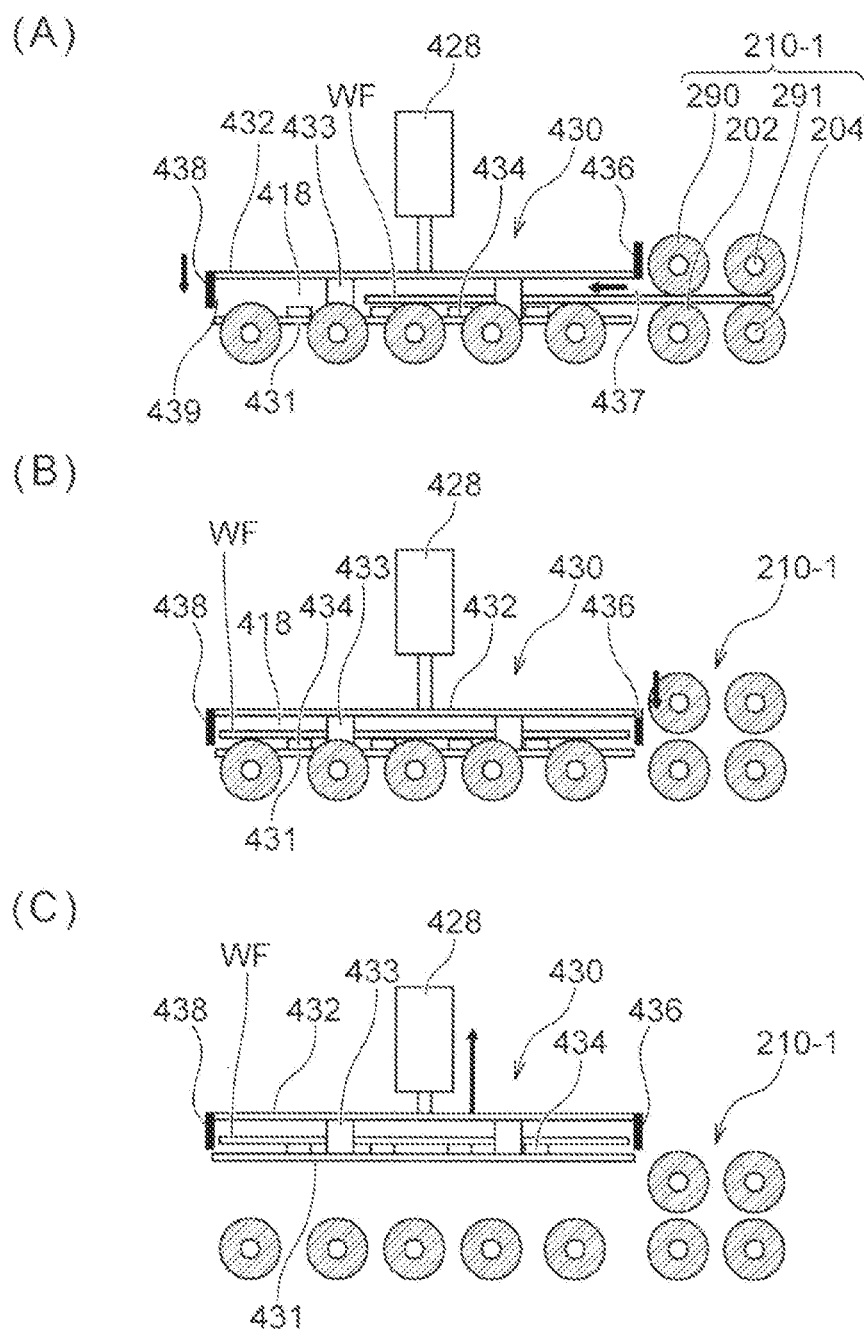
FIG. 8A to FIG. 8C are side views schematically illustrating the transfer machine according to the one embodiment.

FIG. 7A to FIG. 7E include side views, plan views, and a cross-sectional view schematically illustrating the transfer machine according to the one embodiment. FIG. 7A is a side view viewed in an A direction in FIG. 6. FIG. 7B is a side view viewed in a B direction in FIG. 6. FIG. 7C is a plan view viewed in a C direction in FIG. 7B. FIG. 7D is a plan view viewed in a D direction in FIG. 7B. FIG. 7E is a cross-sectional view taken along the line E-E in FIG. 7B. FIG. 8A to FIG. 8C are side views schematically illustrating the transfer machine according to the one embodiment. In FIG. 7C, FIG. 7D, and FIG. 7E, the substrate WF is omitted for clarification of the illustration.

As illustrated in FIG. 8A to FIG. 8C, the cleaning module 400 includes the first transfer mechanism 210-1 configured to transfer the substrate WF to the substrate grip or release position 418. The first transfer mechanism 210-1 includes the plurality of rotatable roller shafts 204 disposed at intervals along the transfer direction of the substrate WF below the transfer passage of the substrate WF. The first transfer mechanism 210-1 includes a plurality of rotatable upper roller shafts 291 disposed at intervals along the transfer direction of the substrate WF above the transfer passage of the substrate WF. The first transfer mechanism 210-1 includes the transfer rollers 202 configured to support and transfer the surface to be polished (the lower surface) of the substrate WF. In this embodiment, three transfer rollers 202 are mounted to each roller shaft 204. The first transfer mechanism 210-1 includes the upper transfer rollers 290 configured to sandwich and transfer the substrate WF together with the transfer rollers 202. In this embodiment, three upper transfer rollers 290 are mounted to each upper roller shaft 291. At the substrate grip or release position 418, for substrate grip or release, the upper roller shaft 291 and the upper transfer roller 290 are not disposed, and only the roller shafts 204 and the transfer rollers 202 are disposed. The roller shafts 204 and the transfer rollers 202 at the substrate grip or release position 418 transfer the substrate WF to the substrate grip or release position 418 and further transfer the substrate WF that has undergone the ultrasonic cleaning from the substrate grip or release position 418 to the downstream side and, thus, have both the function of the first transfer mechanism 210-1 and the function of the second transfer mechanism 210-2.

In one embodiment, the transfer roller 202 and the upper transfer roller 290 of the cleaning module 400 can be constituted of a conductive polymer. The transfer rollers 202 and the upper transfer rollers 290 are electrically grounded via the roller shafts 204 and the upper roller shafts 291. This is for preventing the substrate WF from being electrically charged and being damaged. Since the transfer rollers 202 and the upper transfer rollers 290 are driven by the gear 206 and the motor 208 similarly to ones described in the transfer module 200, detailed descriptions of the structure and the driving mechanism will be omitted.

As illustrated in FIG. 7A to FIG. 7E and FIG. 8A to FIG. 8C, the transfer machine 420 includes a housing mechanism 430 that forms a housing space 435 for housing the substrate WF transferred to the substrate grip or release position 418 along the transfer passage 405 by the first transfer mechanism 210-1. The housing mechanism 430 includes a supporting member 431 for supporting the surface to be polished of the substrate WF, an upper member 432 opposed to the supporting member 431 at a distance above the supporting member 431, and a column member 433 that connects the supporting member 431 to the upper member 432. The housing space 435 is formed by the supporting member 431, the upper member 432, and the column member 433. Protrusions 434 that are brought into contact with the surface to be polished of the substrate WF are disposed on the supporting member 431.

As illustrated in FIG. 8A to FIG. 8C, the housing mechanism 430 includes an inlet 437 for loading the substrate WF into the housing space 435 and a first shutter 436 for opening and closing the inlet 437. The housing mechanism 430 includes an outlet 439 for unloading the substrate WF from the housing space 435 and a second shutter 438 for opening and closing the outlet 439. As illustrated in FIG. 8A, when the substrate WF is being loaded into the housing space 435, the housing mechanism 430 is configured to move the second shutter 438 downward to close the outlet 439 and causes the first shutter 436 to wait on an upper side to open the inlet 437. As illustrated in FIG. 8B, when the substrate WF is loaded into the housing space 435, the housing mechanism 430 is configured to move the first shutter 436 downward to close the inlet 437. The transfer machine 420 includes a lifting mechanism 428 for lifting up and lowering the housing mechanism 430. The lifting mechanism 428 can be achieved by, for example, a known mechanism such as a motor. As illustrated in FIG. 8C, when the substrate WF is loaded in the housing space 435 and the inlet 437 is closed, the transfer machine 420 is configured to hold the substrate WF by moving the housing mechanism 430 upward by the lifting mechanism 428.

As illustrated in FIG. 6, the transfer machine 420 includes a moving mechanism 424 configured to move the housing mechanism 430 along a transfer shaft 422 extending in a direction perpendicular to the transfer passage 405 such that the housing mechanism 430 is moved between the substrate grip or release position 418 and the ultrasonic cleaning tank 440. The moving mechanism 424 can be achieved by, for example, a known mechanism such as a motor. The transfer machine 420 is configured to hold the substrate WF having been transferred to the substrate grip or release position 418 by the housing mechanism 430 and carry the substrate WF to a position immediately above the ultrasonic cleaning tank 440 by the moving mechanism 424.

The transfer machine 420 includes an inclination mechanism 426 for inclining the housing mechanism 430. The inclination mechanism 426 can be achieved by, for example, a known mechanism such as a tilt mechanism. The transfer machine 420 inclines the substrate WF by the inclination mechanism 426 after having carried the substrate WF to the position immediately above the ultrasonic cleaning tank 440. The inclination mechanism 426 does not incline the substrate WF to such an extent that the substrate WF is vertically oriented and, by inclining the substrate WF in a rage of, for example, 20 degrees or less, preferably 10 degrees or less, maintains a state where the surface to be polished of the substrate WF faces downward. With the substrate WF inclined, the transfer machine 420 immerses the substrate WF into the ultrasonic cleaning tank 440 by lowering the housing mechanism 430 by the lifting mechanism 428. By slightly inclining the substrate WF and controlling an input speed into the ultrasonic cleaning tank 440 to a relatively gentle speed by the lifting mechanism 428, the transfer machine 420 can immerse the substrate WF into the ultrasonic cleaning tank 440 with a reduced resistance to the substrate caused by the cleaning liquid during substrate immersion. Thus, even a substrate having a size of a length of one side exceeding 500 mm can be cleaned with insignificant damage to the substrate.

As illustrated in FIG. 5, the ultrasonic cleaning tank 440 includes an ultrasonic irradiating device 442 for applying the ultrasonic waves on the substrate WF immersed in the cleaning liquid housed inside the ultrasonic cleaning tank 440. The ultrasonic cleaning tank 440 can clean the residue such as the slurry adhering to the surface to be polished and the backside surface of the substrate WF by emitting ultrasonic waves from the ultrasonic irradiating device 442. According to this embodiment, since a mechanism for varying the posture of the substrate WF to a vertical orientation is unnecessary, the cleaning module 400 having a simple structure can be achieved. According to this embodiment, since, in addition to the cleaning by the cleaning mechanism (the upper cleaning nozzle 284a and the lower cleaning nozzle 284b) of the transfer module 200, the cleaning by the ultrasonic cleaning tank 440 is performed, cleaning capability for the substrate WF can be improved. Furthermore, according to this embodiment, since the ultrasonic cleaning tank 440 performs the ultrasonic cleaning and removal of the substrate WF with the substrate WF having an inclined posture, comparing a case where the substrate WF is cleaned with the substrate WF having a vertically oriented posture, it is possible to suppress re-adhering of the residue peeled off from the substrate WF to the substrate WF.

When the substrate WF is cleaned in the ultrasonic cleaning tank 440, the transfer machine 420 can move the housing mechanism 430 in a roll direction using the inclination mechanism 426. This can prevent the left-uncleaned part from being generated because portions with which the substrate WF is brought into contact can be displaced with respect to the protrusions 434 of the housing mechanism 430. For a similar purpose of preventing the left-uncleaned part from being generated, the housing mechanism 430 may be swinged by reciprocating the housing mechanism 430 along the transfer shaft 422 using the moving mechanism 424.

As illustrated in FIG. 5, the cleaning module 400 includes two scrub cleaning mechanisms 450A, 450B disposed on a substrate transfer downstream side the with respect to the substrate grip or release position of the transfer passage 405. Since the two scrub cleaning mechanisms 450A, 450B can have a similar configuration, they will be collectively described below as a scrub cleaning mechanism 450.

Figure 9:
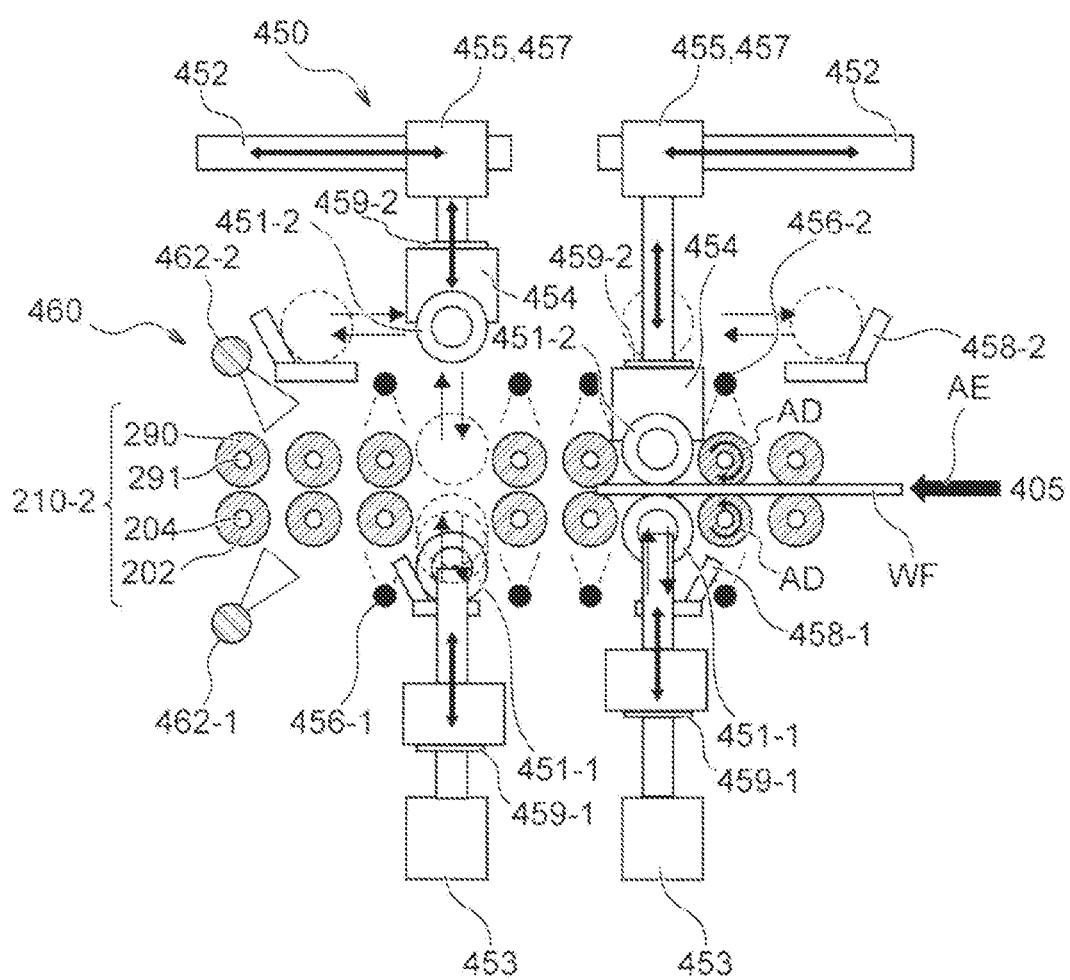
FIG. 9 is a side view schematically illustrating a scrub cleaning mechanism according to the one embodiment.
Figure 10:
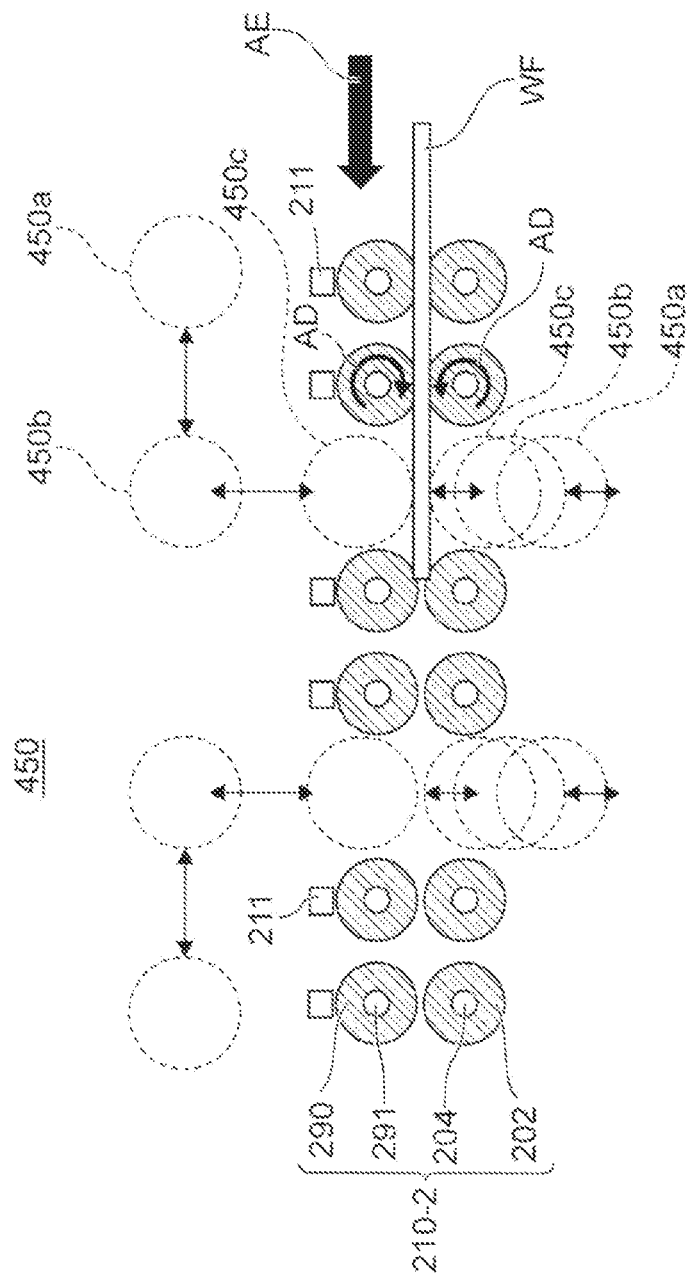
FIG. 10 is a side view schematically illustrating the scrub cleaning mechanism according to the one embodiment.

FIG. 9 is a side view schematically illustrating the scrub cleaning mechanism according to the one embodiment. FIG. 10 is a side view schematically illustrating positions of roll sponges of the scrub cleaning mechanism according to the one embodiment. As illustrated in FIG. 9, the cleaning module 400 includes the second transfer mechanism 210-2. Since the second transfer mechanism 210-2 has a configuration similar to that of the first transfer mechanism 210-1, detailed explanation will be omitted. The scrub cleaning mechanism 450 includes a first roll sponge 451-1 that is brought into contact with the surface to be polished of the substrate WF transferred by the second transfer mechanism 210-2 and rotates at a predetermined rotation speed by a rotation mechanism (not illustrated) and a lifting mechanism 453 for lifting up and lowering the first roll sponge 451-1 via a load cell 459-1. The scrub cleaning mechanism 450 includes a second roll sponge 451-2 that is brought into contact with the backside surface of the substrate WF transferred by the second transfer mechanism 210-2 and rotates at a predetermined rotation speed by a rotation mechanism (not illustrated) and a roll holder 454 for holding the second roll sponge 451-2. Furthermore, the scrub cleaning mechanism 450 includes a lifting mechanism 455 for lifting up and lowering the second roll sponge 451-2 via a load cell 459-2 mounted to the roll holder 454 and a horizontal driving mechanism 457 for driving the second roll sponge 451-2 along a shaft 452 extending parallel to the transfer passage 405. The first roll sponge 451-1 and the second roll sponge 451-2 are disposed opposed to one another across the second transfer mechanism 210-2. The lifting mechanism 453, the lifting mechanism 455, and the horizontal driving mechanism 457 can be achieved by, for example, a known mechanism such as a motor. The lifting mechanism 453 and the lifting mechanism 455 may lift up and lower the first roll sponge 451-1 and the second roll sponge 451-2 symmetrically in an up-down direction relative to the substrate WF or can lift up and lower them individually.

The load cell 459-1 is a measuring device that measures a force with which the lifting mechanism 453 presses the first roll sponge 451-1 against the substrate WF. The load cell 459-2 is a measuring device that measures a force with which the lifting mechanism 455 presses the second roll sponge 451-2 against the substrate WF. When the first roll sponge 451-1 and the second roll sponge 451-2 are individually lifted up or lowered, the scrub cleaning mechanism 450 is configured to perform a closed-loop control of a pressing force of the first roll sponge 451-1 against the substrate WF based on a measurement value of the load cell 459-1. Similarly, the second roll sponge 451-2 is closed loop controlled based on a measurement value of the load cell 459-2. For example, the scrub cleaning mechanism 450 can perform a position control of the first roll sponge 451-1 and the second roll sponge 451-2 such that the measurement values of the load cell 459-1 and the load cell 459-2 become preliminarily set specified values. When the first roll sponge 451-1 and the second roll sponge 451-2 are lifted up or lowered symmetrically in the up-down direction relative to the substrate WF, the scrub cleaning mechanism 450 may refer to the load cell 459-1 or may refer to the load cell 459-2 as the measurement value using for the closed-loop control. However, when referring to any one of the load cell 459-1 and the load cell 459-2, it is likely that a situation in which the substrate WF is in one-side contact with one of the first roll sponge 451-1 and the second roll sponge 451-2 due to warpage or the like cannot be detected. For example, when the closed-loop control is performed based on the measurement value of the load cell 459-2, even when the substrate WF is not brought into contact with the first roll sponge 451-1 and the upper surface of the substrate WF is not cleaned, the scrub cleaning mechanism 450 cannot detect this. Thus, the scrub cleaning mechanism 450 can perform the position control of the first roll sponge 451-1 and the second roll sponge 451-2 based on an average value of the measurement value of the load cell 459-1 and the measurement value of the load cell 459-2. In this case, when the substrate WF is in one-side contact, any one of the measurement values of the load cell 459-1 and the load cell 459-2 becomes zero, and the average value of them is also reduced to half. Then, the scrub cleaning mechanism 450 controls the first roll sponge 451-1 and the second roll sponge 451-2 to be closer to the substrate WF to increase the pressing force. As a result, the substrate WF can recover from a situation of being in the one-side contact, and the scrub cleaning mechanism 450 can clean both the upper and lower surfaces of the substrate WF. When a difference between the measurement values of the load cell 459-1 and the load cell 459-2 and the preliminarily set specified value exceeds a threshold value, the scrub cleaning mechanism 450 can perform a feedback control of the positions of the first roll sponge 451-1 and the second roll sponge 451-2. This is because hunting is likely to occur if the feedback control is performed even when the difference between the measurement values of the load cell 459-1 and the load cell 459-2 and the preliminarily set specified value is small. Since it is conceivable that the measurement values of the load cell 459-1 and the load cell 459-2 include noises caused by steps of the first roll sponge 451-1 and the second roll sponge 451-2, vibration of the substrate WF, or the like, the scrub cleaning mechanism 450 can also obtain a moving average of the measurement values and use it for the position control.

As illustrated in FIG. 9, the scrub cleaning mechanism 450 includes a plurality of first cleaning nozzles 456-1 for injecting the cleaning liquid onto the surface to be polished of the substrate WF when performing roll cleaning of the substrate WF using the first roll sponge 451-1. The scrub cleaning mechanism 450 includes a plurality of second cleaning nozzles 456-2 for injecting the cleaning liquid onto the backside surface of the substrate WF when performing the roll cleaning of the substrate WF using the second roll sponge 451-2.

As illustrated in FIG. 9, the scrub cleaning mechanism 450 includes a first cleaning mechanism 458-1 for coming into contact with the first roll sponge 451-1 to clean the first roll sponge 451-1. The scrub cleaning mechanism 450 includes a second cleaning mechanism 458-2 for coming into contact with the second roll sponge 451-2 to clean the second roll sponge 451-2. While in one example, the first cleaning mechanism 458-1 and the second cleaning mechanism 458-2 can be constituted of quartz plates for removing stain such as waste adhering to the roll sponge by being brought into contact with the roll sponge, they are not limited to this.

The first cleaning mechanism 458-1 and the second cleaning mechanism 458-2 are disposed not to be opposed to one another across the second transfer mechanism 210-2, that is, disposed at different positions in the transfer direction of the substrate so as not to overlap one another in the vertical direction. This is because the stain having adhered to the second roll sponge 451-2 is likely to drop on the first roll sponge 451-1 to contaminate the first roll sponge 451-1 when the second cleaning mechanism 458-2 is disposed immediately above the first cleaning mechanism 458-1. By disposing the first cleaning mechanism 458-1 and the second cleaning mechanism 458-2 so as not to overlap one another in the up-down direction as in this embodiment, contamination of the first roll sponge 451-1 due to the stain having adhered to the second roll sponge 451-2 can be suppressed.

As illustrated in FIG. 10, the first roll sponge 451-1 and the second roll sponge 451-2 are disposed at a roll cleaning position 450a except during the cleaning of the substrate WF. When the substrate WF is transferred to the scrub cleaning mechanism 450, the first roll sponge 451-1 and the second roll sponge 451-2 move to a substrate cleaning position 450c via a cleaning preparation position 450b to clean the substrate WF. When the cleaning of the substrate WF is terminated, the first roll sponge 451-1 and the second roll sponge 451-2 move to the roll cleaning position 450a via the cleaning preparation position 450b.

Next, a pressing mechanism for enhancing the cleaning capability for the substrate WF in the scrub cleaning mechanism 450 will be described. As illustrated in FIG. 10, in a region where the scrub cleaning mechanism 450 is disposed, the second transfer mechanism 210-2 includes a plurality of pressing mechanisms 211 configured to press the upper transfer roller 290 in the direction of the transfer passage of the substrate WF. This is for dealing with a problem that an external force acts on the substrate WF due to the cleaning by the first roll sponge 451-1 and the second roll sponge 451-2 in the scrub cleaning mechanism 450 of this embodiment, which interferes with the substrate transfer. Specifically, the substrate WF is cleaned by the rotating first roll sponge 451-1 and second roll sponge 451-2 being pressed against the substrate WF. During cleaning, by rotatably driving the roller shafts 204 and the upper roller shafts 291, traction (a driving force due to adhesive friction) is applied to the substrate WF from the transfer rollers 202 and the upper transfer rollers 290 in contact with the substrate WF, and the substrate WF is transferred. Thus, the entire substrate surface is cleaned by transferring the substrate WF while cleaning it.

During the cleaning, the substrate WF, and the transfer rollers 202 and the upper transfer rollers 290 are in a grip state, the substrate WF is transferred in the transfer direction indicated by an arrow AE of the transfer passage 405 at an outer circumferential speed of the transfer rollers 202 and the upper transfer rollers 290 that rotate in an opposite directions with one another as indicated by an arrow AD with the substrate WF sandwiched therebetween, without slipping with respect to the transfer rollers 202 and the upper transfer rollers 290. On the other hand, the first roll sponge 451-1 and the second roll sponge 451-2 slip with respect to the substrate WF while rotating clockwise or counterclockwise, and with this, the first roll sponge 451-1 and the second roll sponge 451-2 rub the surface of the substrate WF and clean the substrate WF. That is, since the largest friction force between the substrate WF, and the transfer rollers 202 and the upper transfer rollers 290 is larger than the largest friction force between the substrate WF, and the first roll sponge 451-1 and the second roll sponge 451-2, the transfer rollers 202 and the upper transfer rollers 290 grip the substrate WF, the first roll sponge 451-1 and the second roll sponge 451-2 slip with respect to the substrate WF, and this relationship always needs to be held during cleaning.

Here, assume a case where the first roll sponge 451-1 and the second roll sponge 451-2 are pressed against the substrate WF more strongly in order to improve the cleaning performance. At this time, assume that the largest friction force between the first roll sponge 451-1 and the second roll sponge 451-2, and the substrate WF also increases and exceeds the largest friction force between the transfer rollers 202 and the upper transfer rollers 290, and the substrate WF. Then, the first roll sponge 451-1 and the second roll sponge 451-2 grip the substrate WF, and the transfer rollers 202 and the upper transfer rollers 290 slip with respect to the substrate WF. Then, since the first roll sponge 451-1 and the second roll sponge 451-2 do not rub the surface of the substrate WF, the cleaning performance significantly deteriorates.

When the first roll sponge 451-1 and the second roll sponge 451-2 are in the grip state with respect to the substrate WF, if the first roll sponge 451-1 and the second roll sponge 451-2 rotate faster than the transfer rollers 202 and the upper transfer rollers 290, the substrate WF is forwarded. In contrast, when the first roll sponge 451-1 and the second roll sponge 451-2 rotate reversely with respect to the transfer rollers 202 and the upper transfer rollers 290, the substrate WF is pressed back and thus is not unloaded. In any case, since the first roll sponge 451-1 and the second roll sponge 451-2 do not rub the surface of the substrate WF, cleaning performance is hardly exhibited.

The simplest method for avoiding this problem is to suppress the largest friction force between the first roll sponge 451-1 and the second roll sponge 451-2, and the substrate WF by suppressing the pressing force of the first roll sponge 451-1 and the second roll sponge 451-2 against the substrate WF. However, in this method, since the cleaning performance of the first roll sponge 451-1 and the second roll sponge 451-2 is limited, it is not likely that the substrate is sufficiently cleaned depending on a degree of contamination of the substrate WF.

In order to solve the above-described problem, by pressing the upper transfer rollers 290 to apply a load against the substrate WF, the largest friction between the substrate WF, and the transfer rollers 202 and the upper transfer rollers 290 can be increased. This allows causing the transfer rollers 202 and the upper transfer rollers 290 to grip the substrate WF and cleaning the substrate WF while transferring it even when the first roll sponge 451-1 and the second roll sponge 451-2 are pressed strongly against the substrate WF. In this embodiment, while the example where the upper transfer rollers 290 is pressed strongly against the substrate WF is indicated, the transfer rollers 202 may be pressed strongly against the substrate WF, or both the upper transfer rollers 290 and the transfer rollers 202 may be pressed strongly against the substrate WF.

FIG. 11A and FIG. 11B are side views schematically illustrating a pressing mechanism according to the one embodiment. FIG. 11A illustrates a side view of the pressing mechanism, and FIG. 11B illustrates a cross-sectional view taken along the line B-B in FIG. 11A. Regarding the pressing method of the upper transfer rollers 290, since the upper roller shafts 291 and the upper transfer rollers 290 are rotating, it is difficult to directly apply an external force thereto. Thus, as illustrated in FIG. 11A and FIG. 11B, it is only necessary to apply loads on bearing holders 207 holding bearings 205 disposed in both ends of the upper roller shaft 291. Since an object to be pressed is the upper transfer rollers 290, the upper transfer roller 290 can be pressed against the substrate WF by pressing the upper transfer roller 290 downward via the bearing holders 207 and the upper roller shaft 291.

Timing for pressing the upper transfer rollers 290 against the substrate WF will be described. While there is no problem when the upper transfer rollers 290 already in contact with the substrate WF is pressed against the substrate WF, when a load is applied to the upper transfer rollers 290 that are not yet in contact with the substrate WF, the substrate WF cannot enter between the upper transfer rollers 290 and the transfer rollers 202. That is, it is necessary to sequentially apply a load to the plurality of upper transfer rollers 290 according to the position of the substrate WF to be transferred.

Thus, since the timing of applying a load to each of the plurality of upper transfer rollers 290 is different, it is not possible to collectively press all the upper transfer rollers 290, and a structure in which the pressing is individually performed is required. Since, it is necessary to switch the pressing state according to the transfer position of the substrate WF, as a pressing mechanism of the upper transfer rollers 290, a method of constantly applying a preload using a spring or the like is not suitable.

Based on the above, as a pressing mechanism of the upper transfer rollers 290, a method of driving a motor or solenoid with electric power or pressing with air pressure can be considered. Since it is necessary to individually press the plurality of upper transfer rollers 290, when a motor, a solenoid, or an air cylinder is used, these mechanisms need to be disposed for all the upper transfer rollers 290. When a peripheral space of the upper transfer rollers 290 is not sufficient, employing a cylinder using a diaphragm can make the pressing mechanism compact. Thus, in this embodiment, a pressing mechanism 211 using a diaphragm cylinder is employed. As illustrated in FIG. 11B, the pressing mechanism 211 includes a piston 217 for pressing the bearing holder 207, a cylinder 215 that holds and slides the piston 217 such that the piston 217 can be lifted up and lowered, and a diaphragm 214 for transmitting a pressure to the piston 217. A hole 213 for supplying a compressed fluid to the diaphragm 214 is formed in the cylinder 215. A fluid such as compressed gas, a hydraulic oil, or water is supplied to the hole 213 through a coupling or the like to apply a pressure, and the diaphragm 214 that receives this pressure presses the piston 217 against the bearing holder 207. The pressing mechanism 211 is disposed on each of the plurality of upper transfer rollers 290. Each pressing mechanism 211 is configured to press the substrate WF when the substrate WF is transferred between the transfer rollers 202 and the upper transfer rollers 290.

With the structure of this embodiment, the structure of the pressing mechanism can be made smaller compared to a case where an air cylinder or a motor is used. By simply connecting only a tube to each diaphragm cylinder and controlling the supplied compressed fluid with an electromagnetic valve or the like, a press state and a release state of the piston 217 can be easily switched. Thus, by sequentially pressing the plurality of upper transfer rollers 290 against the transferred substrate WF to increase the largest friction force between both, even when the first roll sponge 451-1 and the second roll sponge 451-2 are strongly pressed against the substrate WF to clean the substrate WF, the substrate WF can be transferred as intended while causing the upper transfer rollers 290 to grip the substrate WF, and high cleaning performance by the first roll sponge 451-1 and the second roll sponge 451-2 can be exhibited.

As illustrated in FIG. 1 and FIG. 9, the cleaning module 400 includes a rinse cleaning mechanism 460 disposed on the substrate transfer downstream side with respect to the scrub cleaning mechanism 450 in the transfer passage 405. The rinse cleaning mechanism 460 includes a first rinse liquid supply nozzle 462-1 for supplying a rinse liquid (for example, pure water) to the surface to be polished of the substrate WF having cleaned by the scrub cleaning mechanism 450 and a second rinse liquid supply nozzle 462-2 for supplying the rinse liquid to the backside surface of the substrate WF. The substrate WF is cleaned with the rinse liquid by the rinse cleaning mechanism 460. The substrate WF cleaned by the rinse cleaning mechanism 460 is unloaded from the cleaning module 400 through an outlet shutter 470 illustrated in FIG. 5. In this embodiment, while the example in which the rinse cleaning by the rinse cleaning mechanism 460 is performed after both the ultrasonic cleaning by the ultrasonic cleaning tank 440 and the roll cleaning by the scrub cleaning mechanism 450 have been performed on the substrate WF has been indicated, it is not limited to this. Depending on the material of the substrate WF, a type of stain adhering to the substrate WF, or the size of the substrate WF, the cleaning module 400 may perform the rinse cleaning after only the ultrasonic cleaning has been performed, or the rinse cleaning can be performed after only the roll cleaning has been performed. The ultrasonic cleaning tank 440 and the scrub cleaning mechanism 450 may include a system that supplies a chemical liquid. This allows achieving the cleaning module 400 that can use both of a physical cleaning method and a chemical cleaning method. Furthermore, the cleaning module 400 may include the plurality of ultrasonic cleaning tanks 440. This allows increasing the types of cleaning liquids that can be used and thus, allows dealing with various kinds of residue adhering to the substrate and improving throughput of the cleaning module 400.

<Drying Module>

The drying module 500 illustrated in FIG. 1 is a device for drying the substrate WF. In the substrate processing apparatus 1000 illustrated in FIG. 1, the drying module 500 dries the substrate WF cleaned by cleaning portions of the transfer module 200 after the polishing has been performed by the polishing module 300. As illustrated in FIG. 1, the drying module 500 is disposed downstream of the cleaning module 400.

The drying module 500 includes nozzles 530 for injecting gas toward the substrate WF being transferred on the transfer rollers 202. The gas can be, for example, compressed air or nitrogen. By blowing off water droplets on the substrate WF, which is being transferred, by the drying module 500, the substrate WF can be dried.

<Unload Module>

The unload module 600 illustrated in FIG. 1 is a module for unloading the substrate WF to the outside of the substrate processing apparatus 1000 after the processing of the polishing, the cleaning, and the like has been performed. In the substrate processing apparatus 1000 illustrated in FIG. 1, the unload module 600 receives the substrate after having been dried by the drying module 500. As illustrated in FIG. 1, the unload module 600 is disposed downstream of the drying module 500. In one embodiment, the unload module 600 is configured to comply with Mechanical Equipment Interface Standard (IPC-SMEMA-9851) of Surface Mount Equipment Manufacturers Association (SMEMA).

The following describes embodiments of the transfer machine, the cleaning module, and the substrate processing apparatus according to the present invention with the attached drawings. In the attached drawings, identical or similar reference numerals are given to identical or similar components, and duplicate explanations regarding the identical or similar components will be omitted in the description of each embodiment, in some cases. Features indicated in each embodiment are applicable to another embodiment as long as they do not conflict with one another.

Figure 12:
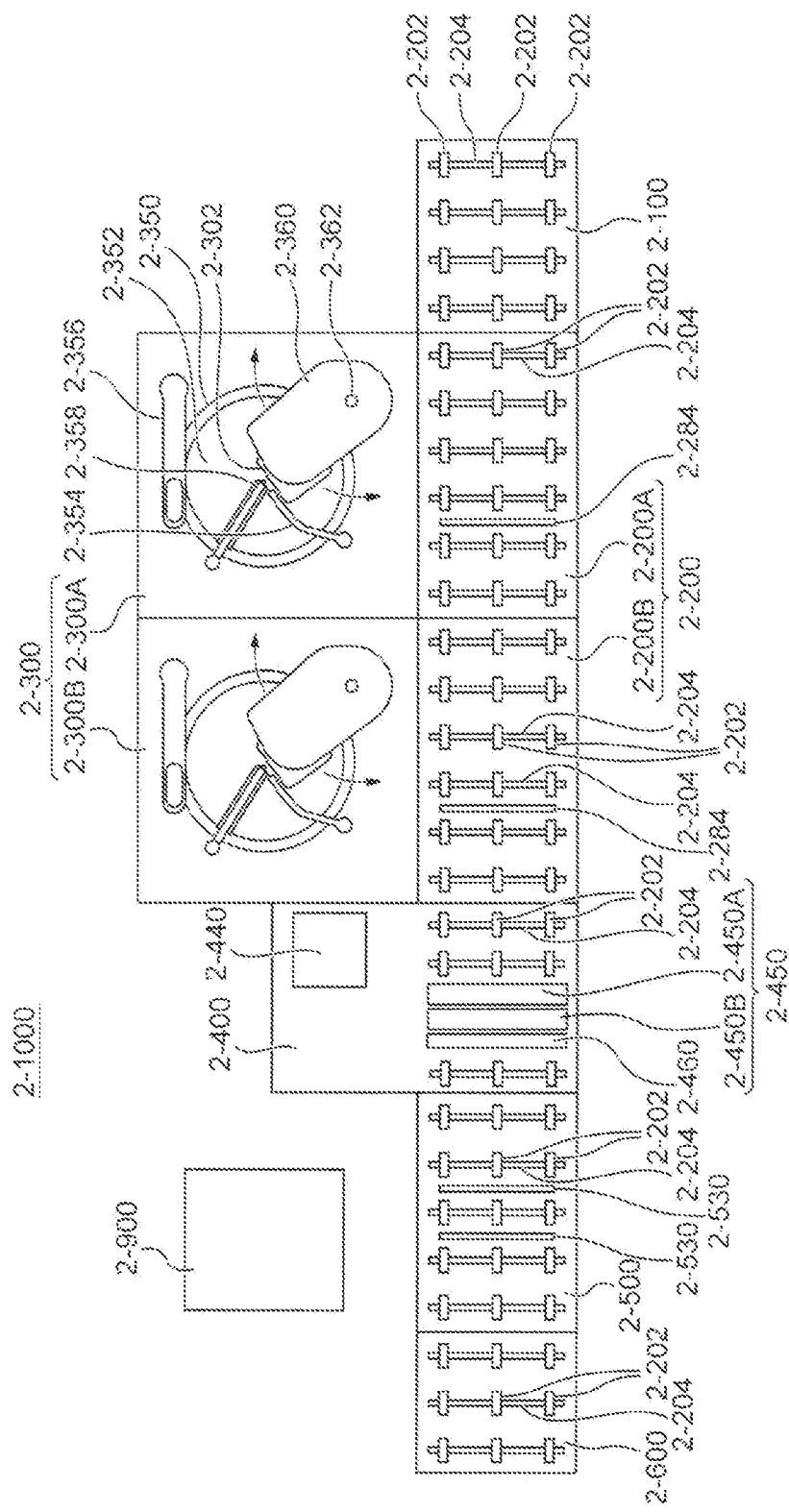
FIG. 12 is a plan view illustrating an overall configuration of a substrate processing apparatus according to one embodiment.

FIG. 12 is a plan view illustrating an overall configuration of a substrate processing apparatus 2-1000 according to one embodiment. The substrate processing apparatus 2-1000 illustrated in FIG. 12 includes a load module 2-100, a transfer module 2-200, a polishing module 2-300, a cleaning module 2-400, a drying module 2-500, and an unload module 2-600. In the illustrated embodiment, the transfer module 2-200 includes two transfer modules 2-200A, 2-200B, and the polishing module 2-300 includes two polishing modules 2-300A, 2-300B. In the one embodiment, each of these modules can be independently formed. By independently forming these modules and conveniently combining the numbers of the respective modules, the substrate processing apparatus 2-1000 having different configuration can be easily formed. The substrate processing apparatus 2-1000 includes a control device 2-900, and each component of the substrate processing apparatus 2-1000 is controlled by the control device 2-900. In one embodiment, the control device 2-900 can be constituted of a general computer including an input/output device, an arithmetic device, a storage device, and the like.

<Load Module>

The load module 2-100 is a module for introducing the substrate WF before the processing such as the polishing and the cleaning is performed into the substrate processing apparatus 2-1000. In the one embodiment, the load module 2-100 is configured to comply with Mechanical Equipment Interface Standard (IPC-SMEMA-9851) of Surface Mount Equipment Manufacturers Association (SMEMA).

In the illustrated embodiment, a transfer mechanism of the load module 2-100 includes a plurality of transfer rollers 2-202 (first transfer rollers) and a plurality of roller shafts 2-204 to which the transfer rollers 2-202 are mounted. In the embodiment illustrated in FIG. 12, three transfer rollers 2-202 are mounted to each roller shaft 2-204. The substrate WF is disposed on the transfer rollers 2-202 and the substrate WF is transferred by the transfer rollers 2-202 rotating. Mounting positions of the transfer rollers 2-202 on the roller shaft 2-204 can be conveniently set as long as they are positions where the substrate WF can be stably transferred. However, since the transfer rollers 2-202 are brought into contact with the substrate WF, the transfer rollers 2-202 should be disposed such that the transfer rollers 2-202 are brought into contact with the substrate WF to be processed in a region where there is no problem even when the transfer rollers 2-202 are brought into contact with it. In one embodiment, the transfer roller 2-202 of the load module 2-100 can be constituted of a conductive polymer. In one embodiment, the transfer rollers 2-202 are electrically grounded via the roller shafts 2-204 and the like. This is for preventing the substrate WF from being electrically charged and thus preventing electronic devices and the like on the substrate WF from being damaged. In one embodiment, an ionizer (not illustrated) may be disposed in the load module 2-100 for preventing the substrate WF from being electrically charged.

<Transfer Module>

The substrate processing apparatus 2-1000 illustrated in FIG. 12 includes two transfer modules 2-200A, 2-200B. Since the two transfer modules 2-200A, 2-200B can have the same configuration, they will be collectively described below as the transfer module 2-200.

Figure 13:
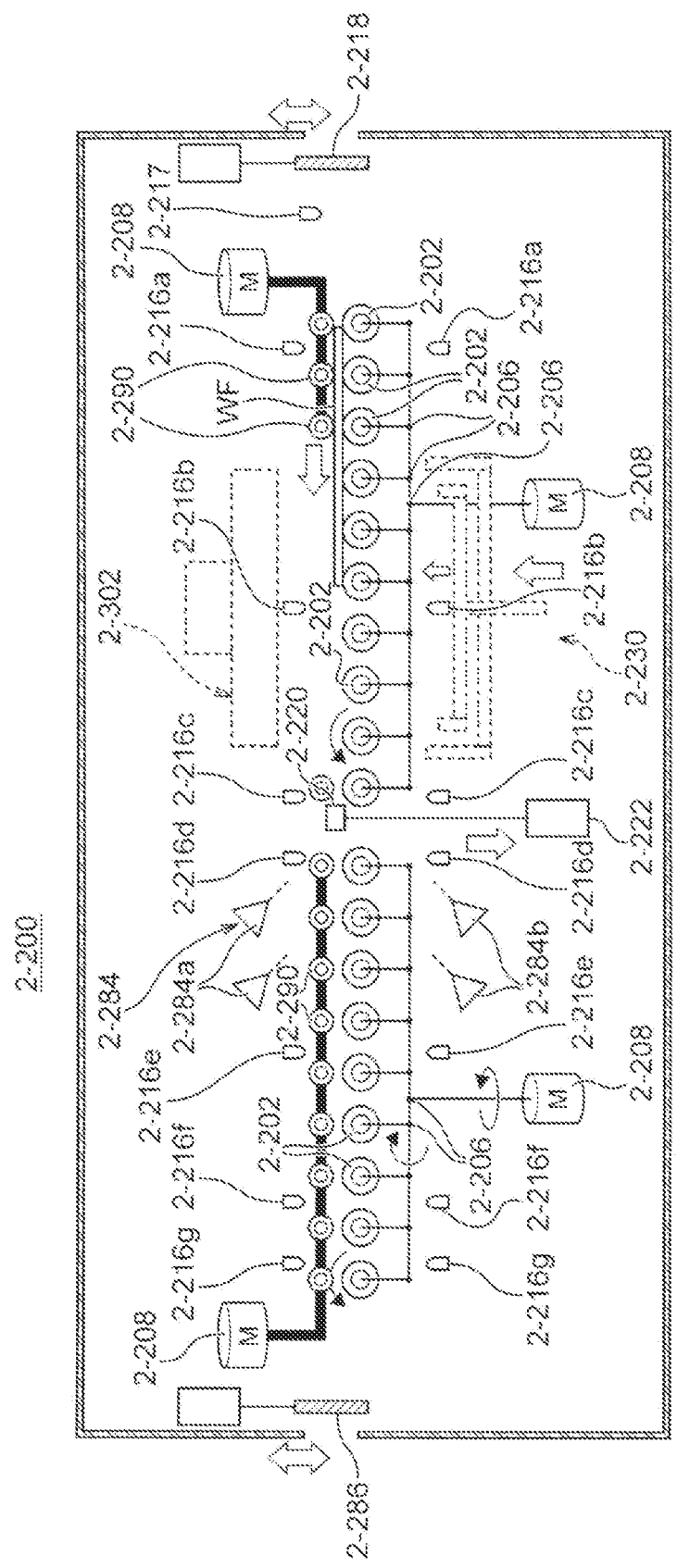
FIG. 13 is a side view schematically illustrating a transfer module according to the one embodiment.
Figure 14:
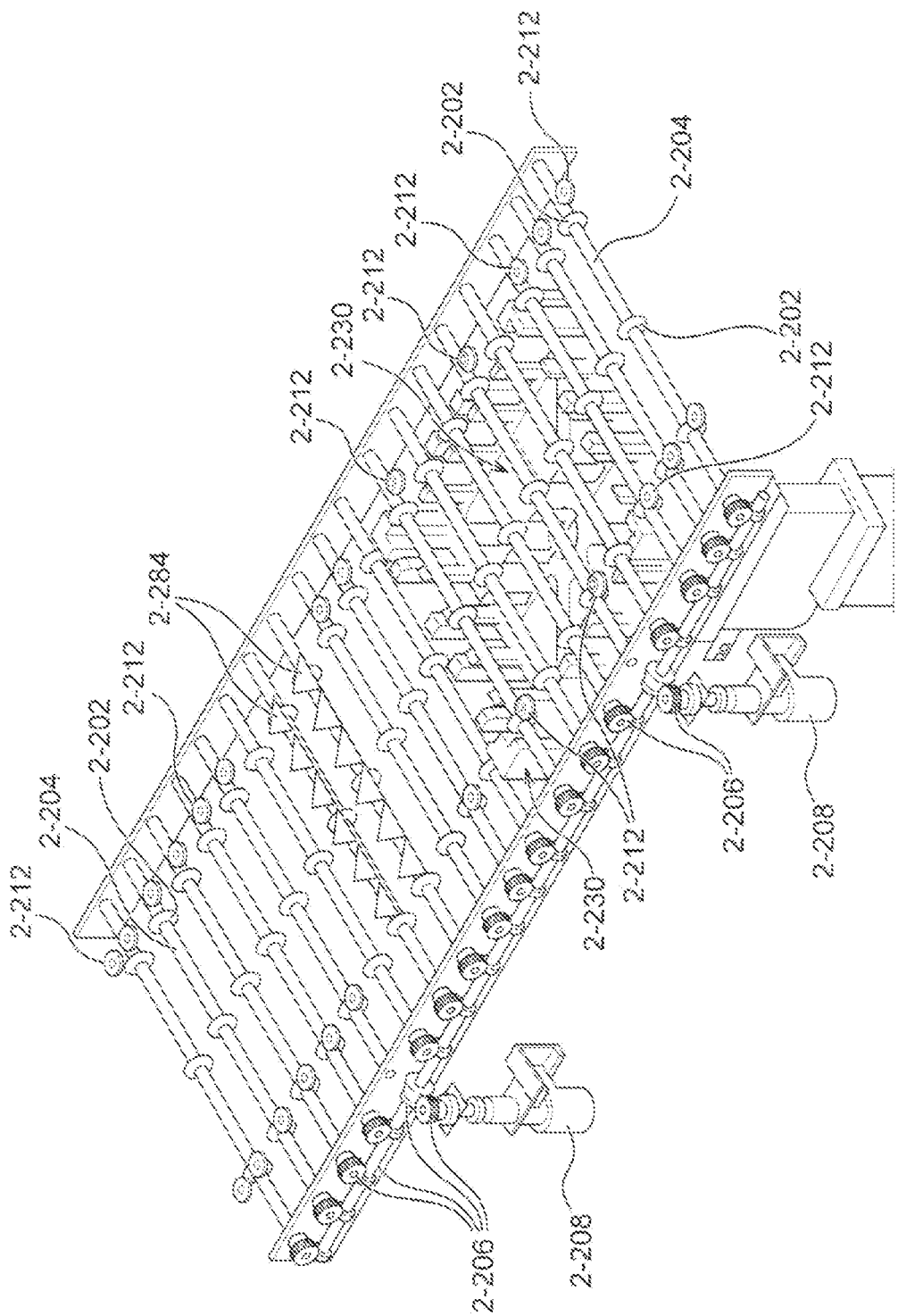
FIG. 14 is a perspective view illustrating the transfer module according to the one embodiment.

FIG. 13 is a side view schematically illustrating the transfer module 2-200 according to the one embodiment. FIG. 14 is a perspective view schematically illustrating the transfer module 2-200 according to the one embodiment. In FIG. 14, for clarification of illustration, upper transfer rollers (second transfer rollers) 2-290 and their driving mechanism, which will be described later, are omitted. The illustrated transfer module 2-200 includes a plurality of transfer rollers (first transfer rollers) 2-202 for transferring the substrate WF. By rotating the transfer rollers 2-202, the substrate WF on the transfer rollers 2-202 can be transferred in a predetermined direction. The transfer roller 2-202 of the transfer module 2-200 may be formed of a conductive polymer or may be formed of a non-conductive polymer. The transfer rollers 2-202 are mounted to the roller shafts (the first roller shafts) 2-204 and are driven by a motor 2-208 via a gear 2-206. In one embodiment, the motor 2-208 can be a servo motor, and the gear 2-206 can be a gear type, but can also be a magnet gear. The illustrated transfer module 2-200 includes guide rollers 2-212 that support side surfaces of the substrate WF during transfer.

As illustrated in FIG. 13 and FIG. 14, the transfer module 2-200 includes a pusher 2-230. The pusher 2-230 is configured to be able to lift the substrate WF on the plurality of transfer rollers 2-202 so as to separate the substrate WF from the plurality of transfer rollers 2-202. The pusher 2-230 is configured to be able to grip or release the held substrate WF to the transfer rollers 2-202 of the transfer module 2-200.

As illustrated in FIG. 13, the transfer module 2-200 includes a stopper 2-220. The stopper 2-220 is connected to a stopper moving mechanism 2-222 and can enter into the transfer passage of the substrate WF moving on the transfer rollers 2-202. When the stopper 2-220 is positioned inside the transfer passage of the substrate WF, the side surface of the substrate WF moving on the transfer rollers 2-202 is brought into contact with the stopper 2-220 and the stopper 2-220 can stop the moving substrate WF at a position of the stopper 2-220. When the stopper 2-220 is at a position where it retracts from the transfer passage of the substrate WF, the substrate WF can move on the transfer rollers 2-202. The stop position of the substrate WF by the stopper 2-220 is a position (a grip or release position) where the pusher 2-230 can receive the substrate WF on the transfer rollers 2-202.

The transfer module 2-200 of this embodiment includes a sensor 2-216 for detecting presence/absence of the substrate WF at a predetermined position on the transfer rollers 2-202. The sensor 2-216 can be any type of sensor, for example, an optical sensor. In the embodiment illustrated in FIG. 13, the seven sensors 2-216 (2-216a to 2-216g) are disposed in the transfer module 2-200. In one embodiment, an operation of the transfer module 2-200 can be controlled according to detection of the substrate WF by these sensors 2-216a to 2-216g. As illustrated in FIG. 13, the transfer module 2-200 includes an inlet shutter 2-218 openable/closable for receiving the substrate WF inside the transfer module 2-200.

The sensor 2-216a is disposed on an inlet side of the transfer module 2-200. When the sensor 2-216a confirms that a rear portion of the substrate WF has passed, the inlet shutter 2-218 can be closed. Then, the substrate WF is transferred by the transfer rollers 2-202 while the position of the substrate WF is monitored by the sensor 2-216b disposed on a downstream side of the sensor 2-216a. At this time, the stopper 2-220 is moved into the transfer passage of the substrate WF by the stopper moving mechanism 2-222. The substrate WF that has been transferred on the transfer rollers 2-202 is bought into contact with the stopper 2-220 to be stopped. The sensor 2-216c is disposed at the position of the stopper 2-220, and when the sensor 2-216c detects the substrate WF, the operation of the transfer roller 2-202 is stopped. The substrate WF that has stopped at the position (the grip or release position) of the stopper 2-220 is gripped or released to a top ring 2-302 of the polishing module 2-300 via the pusher 2-230.

The transfer module 2-200 illustrated in FIG. 13 and FIG. 14 includes a cleaning mechanism. As illustrated in FIG. 13 and FIG. 14, the cleaning mechanism includes a cleaning nozzle 2-284. The cleaning nozzle 2-284 includes an upper cleaning nozzle 2-284a disposed above the transfer rollers 2-202 and a lower cleaning nozzle 2-284b disposed below the transfer rollers 2-202. The upper cleaning nozzle 2-284a and the lower cleaning nozzle 2-284b are connected to a supply source of the cleaning liquid (not illustrated). The upper cleaning nozzle 2-284a is configured to supply the cleaning liquid to the upper surface of the substrate WF transferred on the transfer rollers 2-202. The lower cleaning nozzle 2-284b is configured to supply the cleaning liquid to the lower surface of the substrate WF transferred on the transfer rollers 2-202. The upper cleaning nozzle 2-284a and the lower cleaning nozzle 2-284b are configured to have widths approximately equal to or greater than a width of the substrate WF transferred on the transfer rollers 2-202 to clean the whole surfaces of the substrate WF by the substrate WF being transferred on the transfer rollers 2-202. As illustrated in FIG. 13 and FIG. 14, the cleaning mechanism is positioned downstream with respect to the substrate grip or release region of the transfer module 2-200.

As illustrated in FIG. 13, in a region where the grip or release of the substrate WF by the pusher 2-230 is not performed, upper transfer rollers 2-290 are disposed above the transfer rollers 2-202. The upper transfer rollers 2-290 are connected to a power source and is configured to be rotatable. In the one embodiment, the upper transfer rollers 2-290 are configured to be driven by the gear 2-206 and the motor 2-208 similarly to the transfer rollers 2-202.

<Polishing Module>

Figure 15:
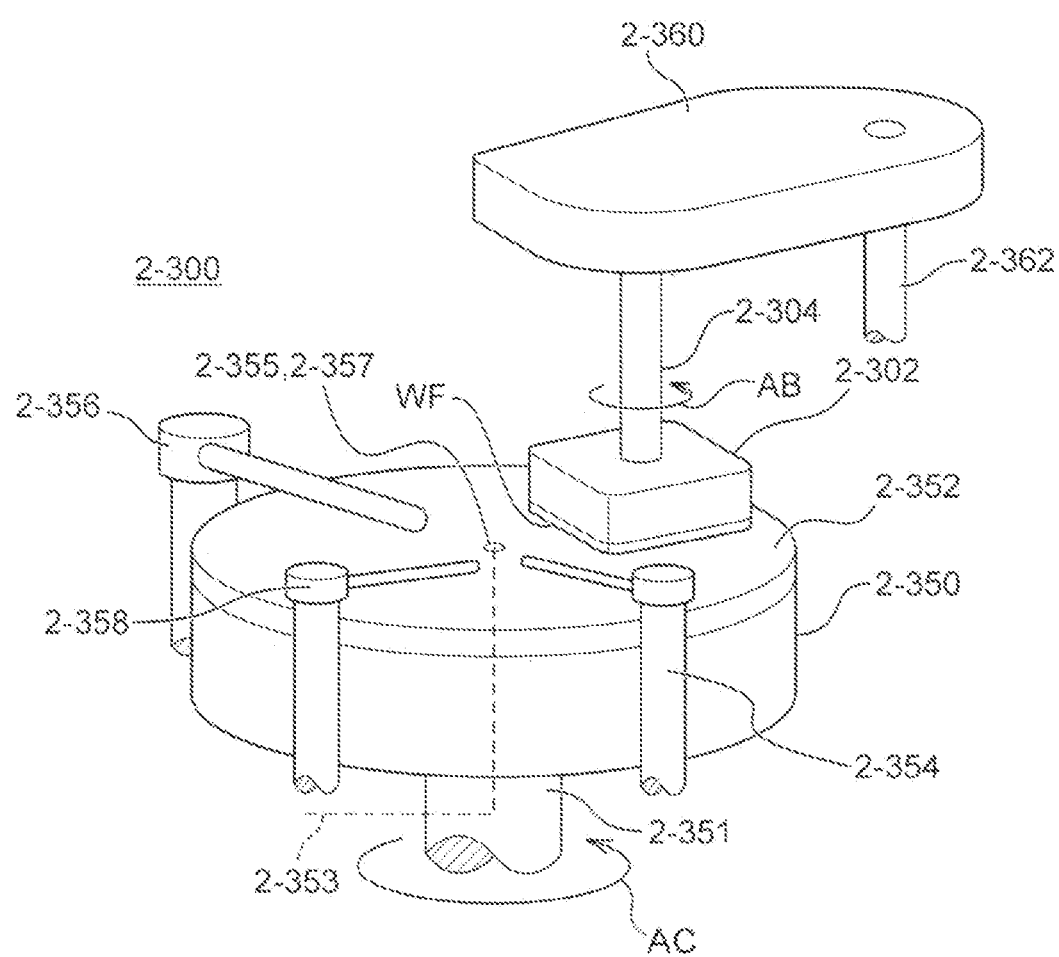
FIG. 15 is a perspective view schematically illustrating a polishing module according to the one embodiment.

FIG. 15 is a perspective view schematically illustrating the polishing module 2-300 according to the one embodiment. The substrate processing apparatus 2-1000 illustrated in FIG. 12 includes the two polishing modules 2-300A, 2-300B. Since the two polishing modules 2-300A, 2-300B can have the same configuration, they will be collectively described below as the polishing module 2-300.

As illustrated in FIG. 15, the polishing module 2-300 includes a polishing table 2-350 and the top ring 2-302. The polishing table 2-350 is supported by a table shaft 2-351. By a driver (not illustrated), the polishing table 2-350 is rotated around a shaft center of the table shaft 2-351 as indicated by an arrow AC. A polishing pad 2-352 is stuck on the polishing table 2-350. The top ring 2-302 holds the substrate WF and presses it against the polishing pad 2-352. The top ring 2-302 is rotatably driven by a driving source (not illustrated). The substrate WF is polished by being held and pressed against the polishing pad 2-352 by the top ring 2-302.

As illustrated in FIG. 15, the polishing module 2-300 includes a polishing liquid supply nozzle 2-354 for supplying a polishing liquid or a dressing liquid to the polishing pad 2-352. The polishing liquid is, for example, slurry. The dressing liquid is, for example, pure water. As illustrated in FIG. 15, a passage 2-353 for supplying the polishing liquid is disposed through the polishing table 2-350 and the table shaft 2-351. The passage 2-353 communicates with an opening portion 2-355 on the surface of the polishing table 2-350. The polishing pad 2-352 has a through-hole 2-357 at a position corresponding to the opening portion 2-355 of the polishing table 2-350, and the polishing liquid passing through the passage 2-353 is supplied onto the surface of the polishing pad 2-352 from the opening portion 2-355 of the polishing table 2-350 and the through-hole 2-357 of the polishing pad 2-352. The polishing module 2-300 includes a dresser 2-356 for performing conditioning of the polishing pad 2-352. The polishing module 2-300 includes an atomizer 2-358 for injecting a liquid or a mixture fluid of the liquid and a gas toward the polishing pad 2-352. The fluid injected from the atomizer 2-358 is, for example, pure water, and the gas is, for example, nitrogen gas.

The top ring 2-302 is supported by a top ring shaft 2-304. The top ring 2-302 rotates around a shaft center of the top ring shaft 2-304 as indicated by an arrow AB, by a driver (not illustrated). The top ring shaft 2-304 can move in an up-down direction by a driving mechanism (not illustrated). The substrate WF is held on a surface opposed to the polishing pad 2-352 of the top ring 2-302 by vacuum suction. During polishing, the polishing liquid is supplied to a polishing surface of the polishing pad 2-352 from the polishing liquid supply nozzle 2-354 and/or the through-hole 2-357 of the polishing pad 2-352. During polishing, the polishing table 2-350 and the top ring 2-302 are rotatably driven. The substrate WF is polished by being pressed against the polishing surface of the polishing pad 2-352 by the top ring 2-302

As illustrated in FIG. 15, the top ring shaft 2-304 is coupled to an arm 2-360, and the arm 2-360 is swingable around a rotation shaft 2-362. During polishing of the substrate WF, the arm 2-360 may be swinged or may be fixed such that the substrate WF covers the through-hole 2-357 of the polishing pad 2-352. As illustrated in FIG. 12, by the swingable arm 2-360, the top ring 2-302 can move toward the transfer module 2-200. By moving to the grip or release position of the transfer module 2-200, the top ring 2-302 can receive the substrate WF from the pusher 2-230. After the polishing of the substrate WF in the polishing module 2-300, the substrate WF can be gripped or released to the pusher 2-230 from the top ring 2-302.

<Cleaning Module>

Figure 16:
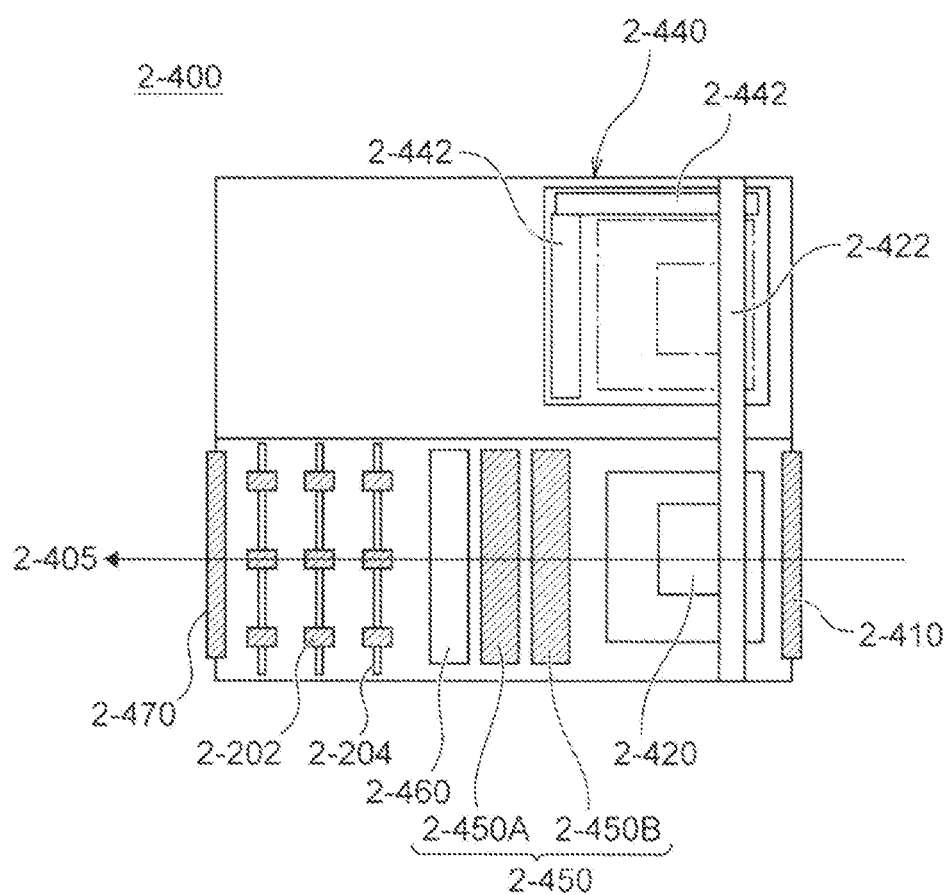
FIG. 16 is a plan view schematically illustrating a cleaning module according to the one embodiment.
Figure 17:
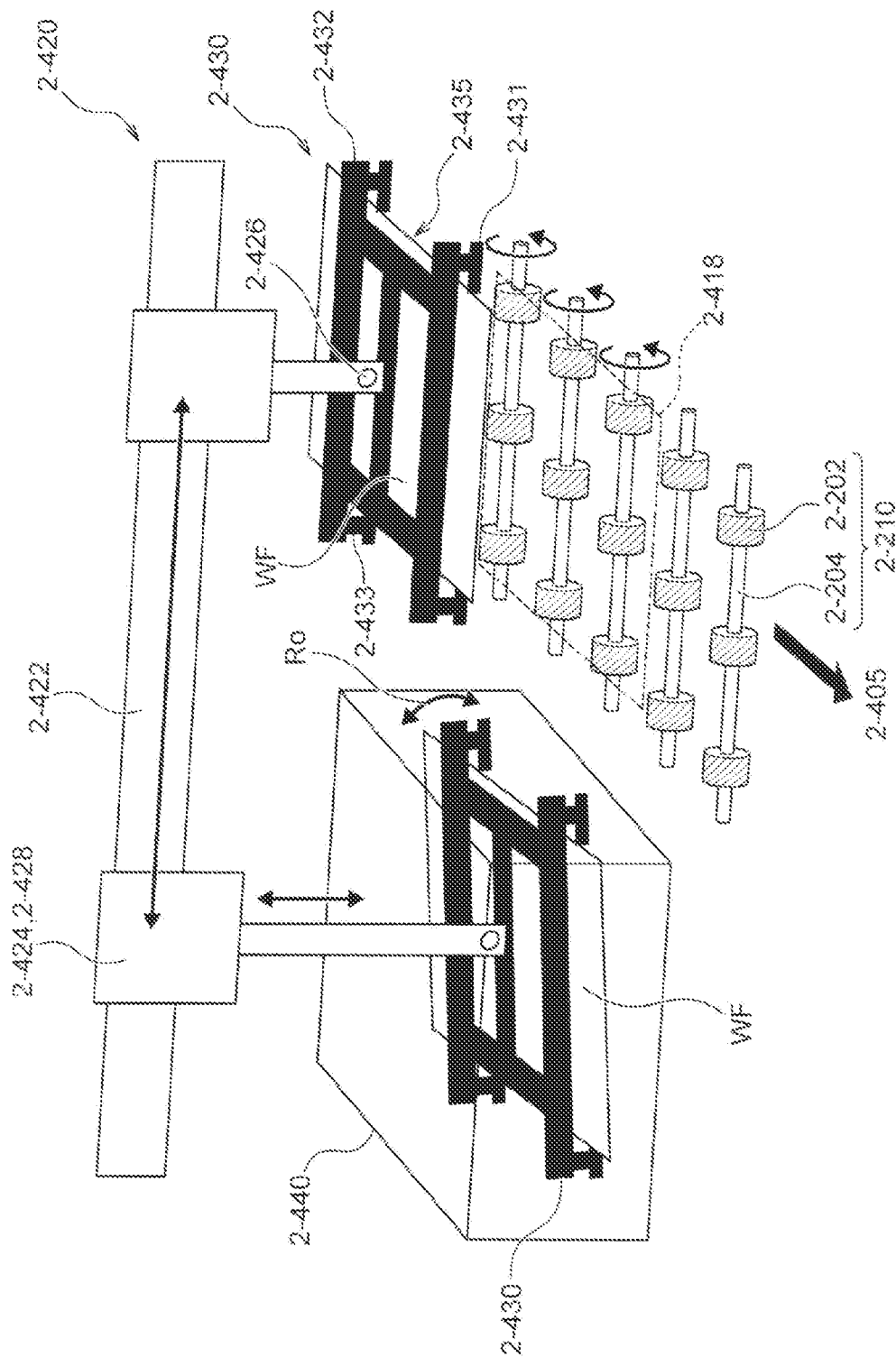
FIG. 17 is a perspective view schematically illustrating the cleaning module according to the one embodiment.
Figure 18:
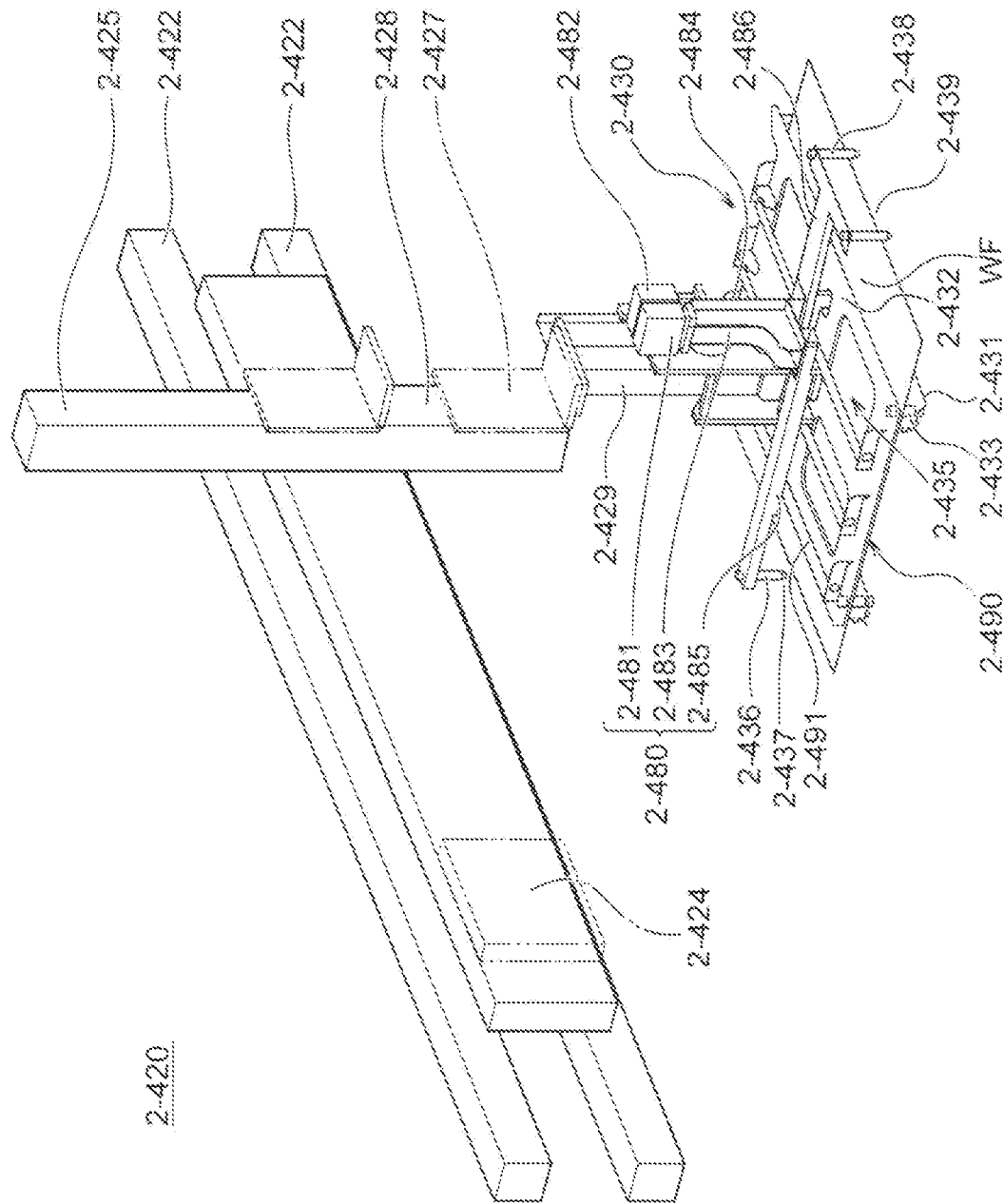
FIG. 18 is a perspective view illustrating a transfer machine illustrated in FIG. 17 in detail.
Figure 19:
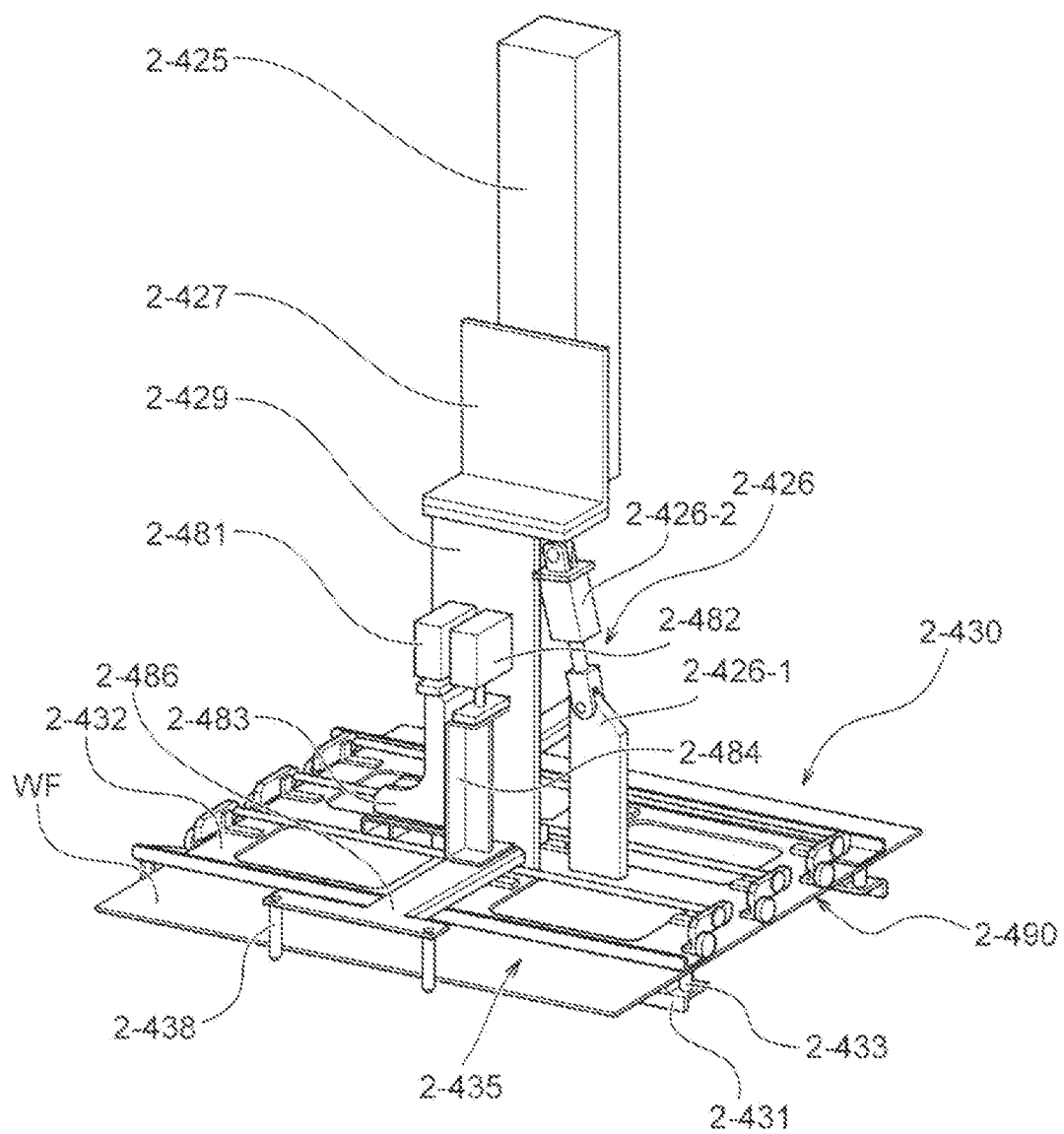
FIG. 19 is a perspective view of a part of the transfer machine illustrated in FIG. 18 viewed from another direction.

The substrate processing apparatus 2-1000 of this embodiment includes the cleaning module 2-400 for removing residue such as slurry that cannot be completely cleaned by the cleaning mechanism (the upper cleaning nozzle 2-284a and the lower cleaning nozzle 2-284b) of the transfer module 2-200 from the substrate WF. FIG. 16 is a plan view schematically illustrating the cleaning module according to the one embodiment. FIG. 17 is a perspective view illustrating the cleaning module according to the one embodiment. FIG. 18 is a perspective view illustrating the transfer machine illustrated in FIG. 17 in detail. FIG. 19 is a perspective view of a part of the transfer machine illustrated in FIG. 18 viewed from another direction.

As illustrated in FIG. 16, the substrate WF polished by the polishing module 2-300 is loaded into the cleaning module 2-400 with the surface to be polished facing downward through an inlet shutter 2-410. As illustrated in FIG. 17, the cleaning module 2-400 includes a transfer mechanism 2-210 for transferring the substrate WF with the surface to be polished facing downward to a substrate grip or release position 2-418 on the downstream side along a transfer passage 2-405 having a linear shape. Since the transfer mechanism 2-210 has a configuration similar to that of the transfer mechanism of the load module 2-100 and the transfer module 2-200, detailed explanations will be omitted. The cleaning module 2-400 includes an ultrasonic cleaning tank 2-440 disposed at a position spaced apart from the transfer passage 2-405 in a direction perpendicular to the transfer passage 2-405. The ultrasonic cleaning tank 2-440 is a cleaning tank for cleaning the substrate WF with the surface to be polished facing downward. The cleaning module 2-400 includes a transfer machine 2-420 for transferring the substrate WF between the substrate grip or release position 2-418 of the transfer passage 2-405 and the ultrasonic cleaning tank 2-440. The transfer mechanism 2-210 has a function to transfer the substrate WF that is transferred from the ultrasonic cleaning tank 2-440 to the substrate grip or release position 2-418 by the transfer machine 2-420 further downstream along the transfer passage 2-405. In a region where the grip or release of the substrate WF by the transfer machine 2-420 is not performed, while the upper transfer rollers 2-290 are disposed above the transfer rollers 2-202, for clarification of illustration, the upper transfer rollers 2-290 and its driving mechanism are omitted in FIG. 16 and FIG. 17.

As illustrated in FIG. 16, the ultrasonic cleaning tank 2-440 includes an ultrasonic irradiating device 2-442 for applying the ultrasonic waves on the substrate WF that is immersed in the cleaning liquid housed inside the ultrasonic cleaning tank 2-440. By emitting the ultrasonic waves from the ultrasonic irradiating device 2-442, the ultrasonic cleaning tank 2-440 can clean the residue such as slurry adhering on the surface to be polished and the backside surface of the substrate WF. According to this embodiment, since, in addition to the cleaning by the cleaning mechanism (the upper cleaning nozzle 2-284a and the lower cleaning nozzle 2-284b) of the transfer module 2-200, the cleaning by the ultrasonic cleaning tank 2-440 is performed, the cleaning capability for the substrate WF can be improved.

As illustrated in FIG. 17 to FIG. 19, the transfer machine 2-420 includes a housing mechanism 2-430 that forms a housing space 2-435 for housing the substrate WF transferred to the grip or release position 2-418 along the transfer passage 2-405 by the transfer mechanism 2-210. The housing mechanism 2-430 includes a supporting member 2-431 for supporting the surface to be polished of the substrate WF, an upper member 2-432 opposed at a distance to the supporting member 2-431 above the supporting member 2-431, and column members 2-433 connecting the supporting member 2-431 to the upper member 2-432. The housing space 2-435 is formed by the supporting member 2-431, the upper member 2-432, and the column members 2-433.

The transfer machine 2-420 includes a lifting mechanism 2-428 configured to lift up or lower the housing mechanism 2-430. The lifting mechanism 2-428 can be achieved by, for example, a known mechanism such as an actuator. The transfer machine 2-420 includes a bracket 2-427 secured to the lifting mechanism 2-428 and a suspension shaft 2-429 extending downward from the bracket 2-427. The housing mechanism 2-430 is mounted to the suspension shaft 2-429. The lifting mechanism 2-428 is configured to lift up or lower the housing mechanism 2-430 along a lifting shaft 2-425 extending in the up-down direction. In order to move the housing mechanism 2-430 between the grip or release position 2-418 and the ultrasonic cleaning tank 2-440, the transfer machine 2-420 includes a moving mechanism 2-424 configured to move the housing mechanism 2-430 along a transfer shaft 2-422 extending in a direction perpendicular to the transfer passage 2-405. The moving mechanism 2-424 can be achieved by, for example, a known mechanism such as an actuator. The moving mechanism 2-424 is connected to the lifting shaft 2-425 and is configured to collectively move the lifting shaft 2-425, the lifting mechanism 2-428, the bracket 2-427, the suspension shaft 2-429, and the housing mechanism 2-430 in a direction perpendicular to the transfer passage 2-405. The transfer machine 2-420 is configured to hold the substrate WF transferred to the grip or release position 2-418 by the housing mechanism 2-430, lift up it by the lifting mechanism 2-428, and carry it to a position immediately above the ultrasonic cleaning tank 2-440 by the moving mechanism 2-424.

As illustrated in FIG. 19, the transfer machine 2-420 includes an inclination mechanism 2-426 for inclining the housing mechanism 2-430. In this embodiment, the inclination mechanism 2-426 is mounted to a lower portion of the suspension shaft 2-429 such that an upper portion at an approximately center of the upper member 2-432 is rotatable about an axis parallel to the transfer passage 2-405. The inclination mechanism 2-426 includes an arm 2-426-1 secured to an upper surface of the upper member 2-432 and a cylinder 2-426-2 connected to each of a top portion of the arm 2-426-1 and a lower portion of the bracket 2-427 via a rotation shaft (similarly parallel to the transfer passage 2-405) and can adjust an angle of the housing mechanism 2-430 by pressing or pulling a piston rod of the cylinder 2-426-2. However, the inclination mechanism 2-426 is not limited to the above-described configuration and can be achieved by a known mechanism such as a tilt mechanism. The transfer machine 2-420 inclines the substrate WF by the inclination mechanism 2-426 after having carried the substrate WF to the position immediately above the ultrasonic cleaning tank 2-440. The inclination mechanism 2-426 does not incline the substrate WF to such an extent that the substrate WF is vertically oriented and, by inclining the substrate WF in a rage of, for example, 20 degrees or less, preferably 10 degrees or less, maintains a state where the surface to be polished of the substrate WF faces downward. With the substrate WF inclined, the transfer machine 2-420 immerses the substrate WF into the ultrasonic cleaning tank 2-440 by lowering the housing mechanism 2-430 by the lifting mechanism 2-428. By slightly inclining the substrate WF and controlling the input speed into the ultrasonic cleaning tank 2-440 to a relatively gentle speed by the lifting mechanism 2-428, the transfer machine 2-420 can immerse the substrate WF into the ultrasonic cleaning tank 2-440 with a reduced resistance to the substrate caused by the cleaning liquid during substrate immersion. Thus, even a substrate having a size of a length of one side exceeding 500 mm can be cleaned with insignificant damage to the substrate.

When the substrate WF is cleaned in the ultrasonic cleaning tank 2-440, the transfer machine 2-420 can move the housing mechanism 2-430 in the roll direction indicated by an arrow Ro using the inclination mechanism 2-426. This can prevent the left-uncleaned part from being generated because portions with which the substrate WF is brought into contact can be displaced with respect to pads 2-434, which will be described later, of the housing mechanism 2-430. For a similar purpose of preventing the left-uncleaned part from being generated, the housing mechanism 2-430 may be swinged by reciprocating the housing mechanism 2-430 along the transfer shaft 2-422 using the moving mechanism 2-424.

As illustrated in FIG. 18, the housing mechanism 2-430 includes an inlet 2-437 for loading the substrate WF into the housing space 2-435, an inlet shutter 2-436 disposed at the inlet 2-437, and an inlet opening/closing mechanism 2-480 for opening and closing the inlet 2-437 by lifting up and lowering the inlet shutter 2-436. The inlet opening/closing mechanism 2-480 includes an opening/closing member 2-485 extending in a bar shape in the transfer direction of the substrate WF, a bracket 2-483 secured to an upper surface of the opening/closing member 2-485, and an inlet lifting mechanism 2-481 for lifting up and lowering the opening/closing member 2-485 via the bracket 2-483. The opening/closing member 2-485 is configured to hold the inlet shutter 2-436. Specifically, the inlet shutter 2-436 is mounted at an end on a substrate transfer inlet side of the opening/closing member 2-485 and extends downward from a lower surface of the opening/closing member 2-485. The inlet lifting mechanism 2-481 can be achieved by, for example, a known mechanism such as a cylinder. The inlet lifting mechanism 2-481 can lift up and lower the inlet shutter 2-436 via the bracket 2-483 and the opening/closing member 2-485. The inlet lifting mechanism 2-481 is configured to open the inlet 2-437 by lifting up the inlet shutter 2-436 and close the inlet 2-437 by lowering the inlet shutter 2-436.

The housing mechanism 2-430 includes an outlet 2-439 for unloading the substrate WF from the housing space 2-435, an outlet shutter 2-438 disposed at the outlet 2-439, and an opening/closing member 2-486 holding the outlet shutter 2-438. The housing mechanism 2-430 includes a bracket 2-484 secured to an upper surface of the opening/closing member 2-486 and an outlet lifting mechanism 2-482 for lifting up and lowering the opening/closing member 2-486 via the bracket 2-484. The outlet shutter 2-438 is mounted to an end on a substrate unloading side of the opening/closing member 2-486 and extends downward from a lower surface of the opening/closing member 2-486. The lifting mechanism 2-482 can be achieved by, for example, a known mechanism such as a cylinder. The lifting mechanism 2-482 can lift up and lower the outlet shutter 2-438 via the bracket 2-484 and the opening/closing member 2-486. The lifting mechanism 2-482 is configured to open the outlet 2-439 by lifting up the outlet shutter 2-438 and close the outlet 2-439 by lowering the outlet shutter 2-438.

When the substrate WF is being loaded into the housing space 2-435, the housing mechanism 2-430 is configured to close the outlet 2-439 by moving the outlet shutter 2-438 downward and open the inlet 2-437 by causing the inlet shutter 2-436 to wait on an upper side. When the substrate WF has been loaded in the housing space 2-435, the housing mechanism 2-430 is configured to close the inlet 2-437 by moving the inlet shutter 2-436 downward. When the substrate WF has been loaded in the housing space 2-435 and the inlet 2-437 is closed, the transfer machine 2-420 is constituted to hold the substrate WF by moving the housing mechanism 2-430 upward by the lifting mechanism 2-428 and carry the substrate WF to the position immediately above the ultrasonic cleaning tank 2-440 by the moving mechanism 2-424.

Figure 20:
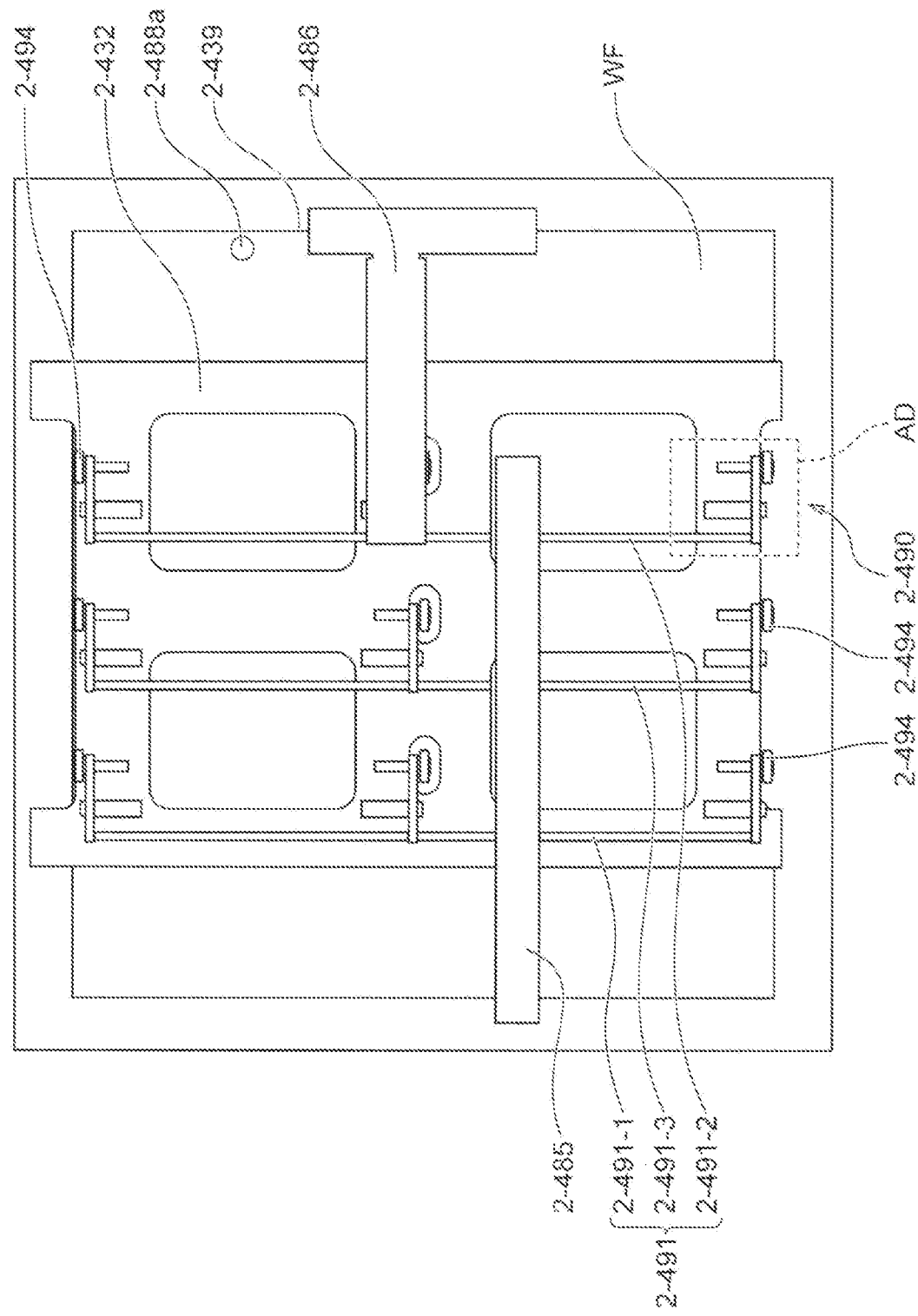
FIG. 20 is a plan view illustrating the transfer machine according to the one embodiment.
Figure 21:
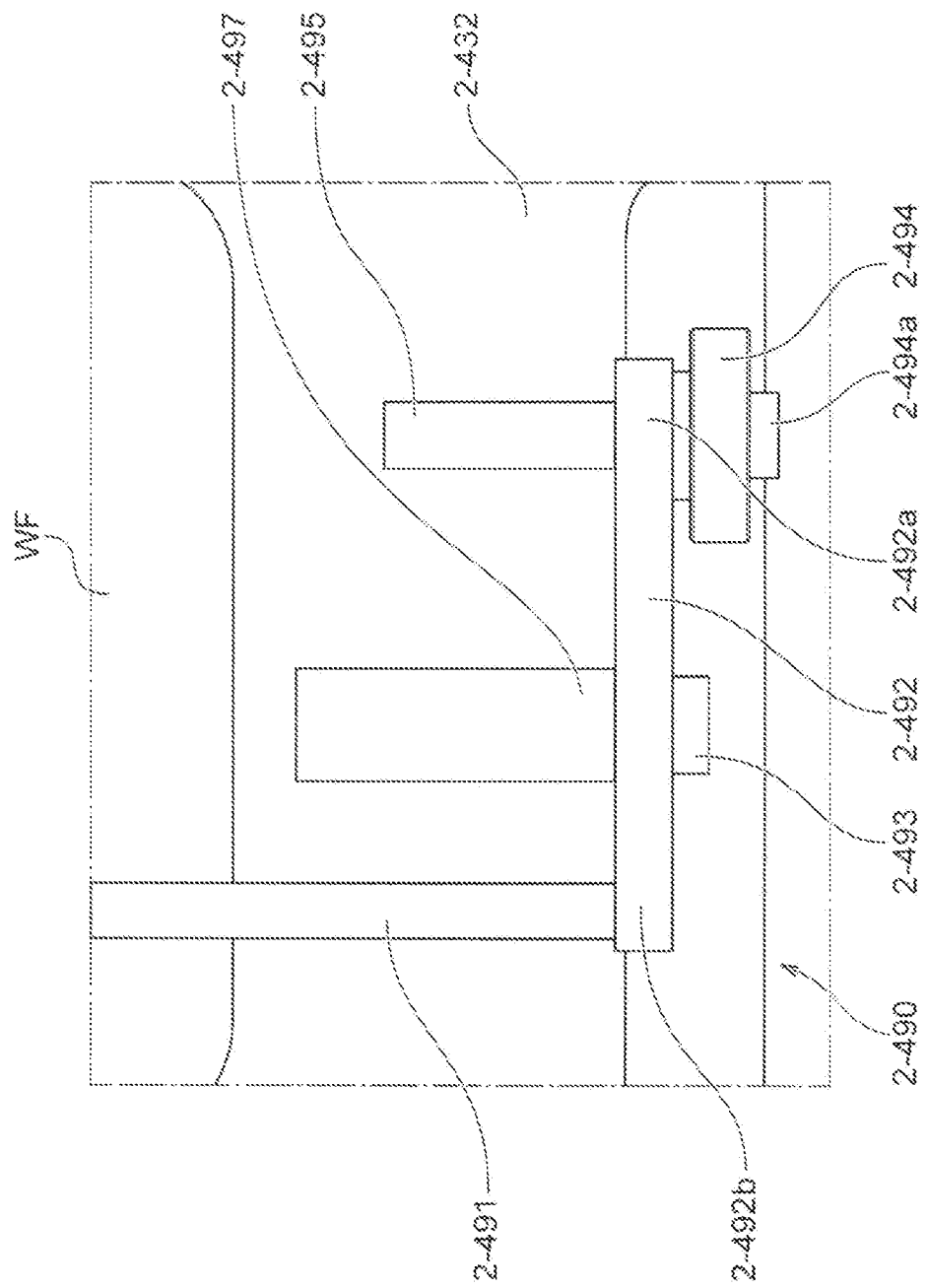
FIG. 21 is a plan view of an enlarged region AD of the transfer machine illustrated in FIG. 20.
Figure 22:
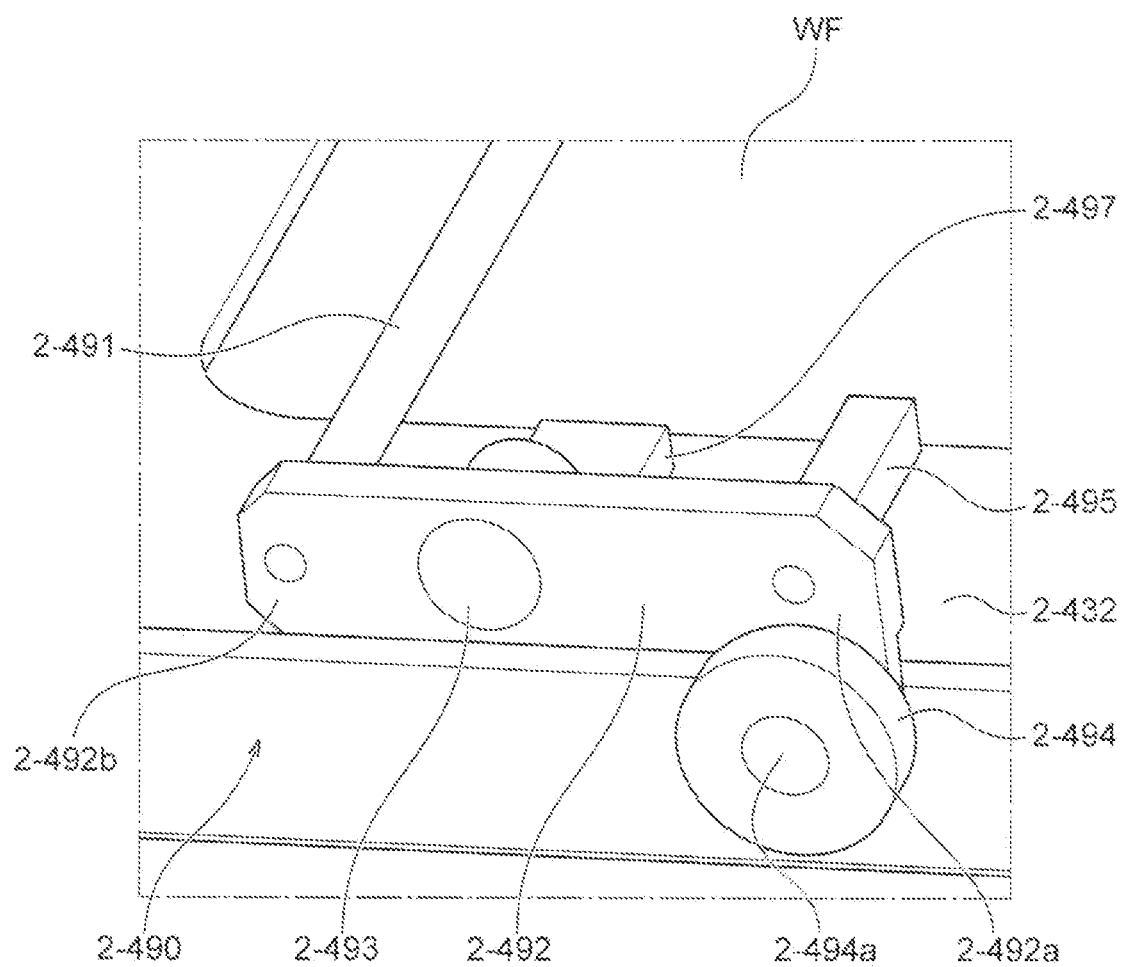
FIG. 22 is a perspective view of the enlarged region AD of the transfer machine illustrated in FIG. 20.

FIG. 20 is a plan view illustrating the transfer machine according to the one embodiment. FIG. 21 is a plan view of an enlarged region AD of the transfer machine illustrated in FIG. 20. FIG. 22 is a perspective view of the enlarged region AD of the transfer machine illustrated in FIG. 20. A sensor (not illustrated) for monitoring presence/absence of the substrate WF at a monitoring position 2-488a near the outlet of the housing mechanism 2-430 illustrated in FIG. 20 is disposed in the transfer mechanism 2-210. In loading the substrate WF into the housing space 2-435, when the presence of the substrate WF is detected by the sensor disposed in the transfer mechanism 2-210, the transfer machine 2-420 can determine that the whole substrate WF has been loaded to the grip or release position 2-418. On the other hand, in unloading the substrate WF from the housing space 2-435, when the absence of the substrate WF is detected by the sensor, the transfer machine 2-420 can determine that the whole substrate WF has been unloaded from the grip or release position 2-418.

As illustrated in FIG. 20, the transfer machine 2-420 includes a guide roller 2-494 that is configured to be brought into contact with the upper surface of the substrate WF transferred to the grip or release position 2-418 to guide the substrate WF. In this embodiment, a plurality of guide rollers 2-494 are disposed so as to be brought into contact with the upper surface of the substrate WF at a plurality of portions. Specifically, three guide rollers 2-494 are disposed along the transfer direction of the substrate WF and three guide rollers 2-494 are disposed along a direction intersecting with (perpendicular to) the transfer direction of the substrate WF. While, in this embodiment, the example in which a total of nine guide rollers 2-494 are disposed has been indicated, the number and arrangement of the guide rollers 2-494 are conveniently set.

For example, when the substrate WF is warped, it is likely that the substrate WF is caught on the housing mechanism 2-430 of the transfer machine 2-420 or the like when the substrate WF is transferred into the housing space 2-435, and is damaged. In contrast, since the substrate WF can be transferred while being guided by the guide rollers 2-494 by disposing the guide rollers 2-494, the substrate WF can be stably guided into the housing space 2-435.

The transfer machine 2-420 includes a guide release mechanism 2-490 configured to separate the guide rollers 2-494 from the substrate WF when the substrate WF is transferred to the grip or release position 2-418. The guide release mechanism 2-490 is configured to separate the guide rollers 2-494 from the substrate WF in conjunction with an operation of closing the inlet 2-437 by lowering the inlet shutter 2-436 by the inlet opening/closing mechanism 2-480.

As illustrated in FIG. 21 and FIG. 22, the guide release mechanism 2-490 includes a link 2-492 to which the guide roller 2-494 are mounted and a rotation shaft 2-493 rotatably supporting the link 2-492. The rotation shaft 2-493 is mounted to a L shaped bracket 2-497 secured to the upper surface of the upper member 2-432 of the housing mechanism 2-430. The rotation shaft 2-493 is configured to support a portion between a first end 2-492a of the link 2-492 to which the guide roller 2-494 is mounted and a second end 2-492b on the opposite side of the first end 2-492a. The guide release mechanism 2-490 is configured to separate the guide rollers 2-494 from the substrate WF by pressing down the second end 2-492b of the link 2-492 in conjunction with the operation of lowering the inlet shutter 2-436 by the inlet opening/closing mechanism 2-480. That is, when the second end 2-492b of the link 2-492 is pressed down, the link 2-492 rotates counterclockwise about the rotation shaft 2-493 to move the first end 2-492a of the link 2-492 in a direction separating from the substrate WF, whereby the guide roller 2-494 is separated from the substrate WF. The link 2-492, the bracket 2-497, and the rotation shaft 2-493 are similarly disposed for each of the nine guide rollers 2-494.

The guide release mechanism 2-490 further includes shafts 2-491 coupling the second ends 2-492b of the plurality of the links 2-492. Specifically, the shafts 2-491 include a first shaft 2-491-1, a second shaft 2-491-2, and a third shaft 2-491-3 that couple three links 2-492 of the three guide rollers 2-494 disposed along a direction intersecting with (perpendicular to) the transfer direction of the substrate WF. The first shaft 2-491-1 couples the second end 2-492b of the three links 2-492 on the upstream side in the transfer direction of the substrate WF, the second shaft 2-491-2 couples the second end 2-492b of the three links 2-492 on the downstream side in the transfer direction of the substrate WF, and the third shaft 2-491-3 couples the second end 2-492b of the three links 2-492 between the upstream side and the downstream side in the transfer direction of the substrate WF. The opening/closing member 2-485 extends along the transfer direction of the substrate WF over the three shafts 2-491 and disposed above the three shafts 2-491. The opening/closing member 2-485 is disposed so as to be brought into contact with the three shafts 2-491 to be able to press the three shafts 2-491 downward when the opening/closing member 2-485 is lowered by the inlet lifting mechanism 2-481.

The guide release mechanisms 2-490 include weights 2-495 mounted to the first ends 2-492a of the links 2-492 such that the guide rollers 2-494 are lowered to a position at which the guide rollers 2-494 are brought into contact with the upper surface of the substrate WF when the second ends 2-492b of the links 2-492 are not pressed down. By including the weights 2-495, since the guide rollers 2-494 are lowered to the position at which the guide rollers 2-494 are brought into contact with the upper surface of the substrate WF when the substrate WF is loaded to the grip or release position 2-418 in the transfer passage 2-405 (when the inlet shutter 2-436 waits on the upper side), the substrate WF can be reliably guided. On the other hand, after the substrate WF is loaded in the transfer machine 2-420, the transfer machine 2-420 is immersed into the ultrasonic cleaning tank 2-440 with the substrate WF housed and the substrate WF undergoes the ultrasonic cleaning. At this time, when the guide rollers 2-494 remain in contact with the upper surface of the substrate WF, since the ultrasonic waves are not irradiated to the portions of the substrate WF with which the guide rollers 2-494 are in contact, it is likely that the left-uncleaned part is generated. In this respect, according to the transfer machine 2-420 of this embodiment, after the substrate WF is transferred to the grip or release position 2-418, the guide rollers 2-494 can be separated from the substrate WF by the guide release mechanism 2-490. Accordingly, since the ultrasonic cleaning can be performed in a state where the guide rollers 2-494 are separated from the substrate WF, the generation of the left-uncleaned part can be suppressed.

Figure 24:
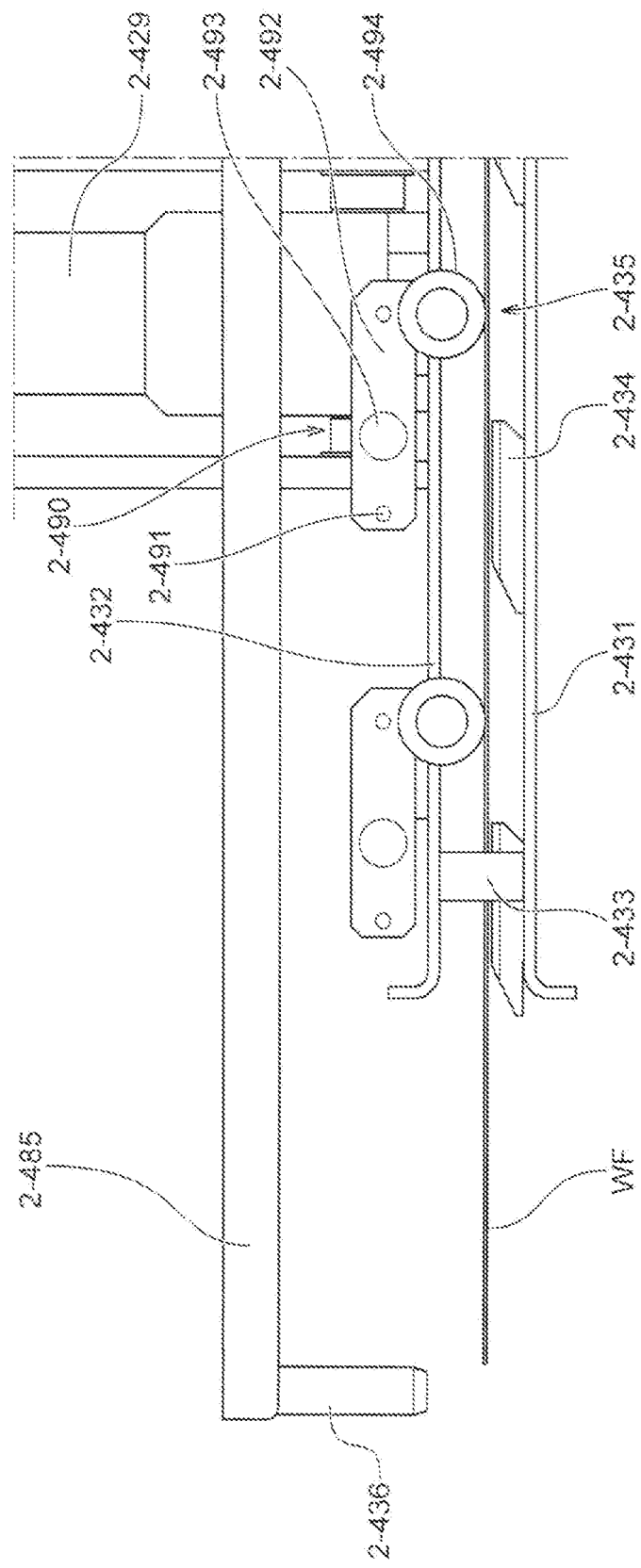
FIG. 24 is a side view illustrating a state where a guide roller of the transfer machine is brought into contact with the substrate.
Figure 25:
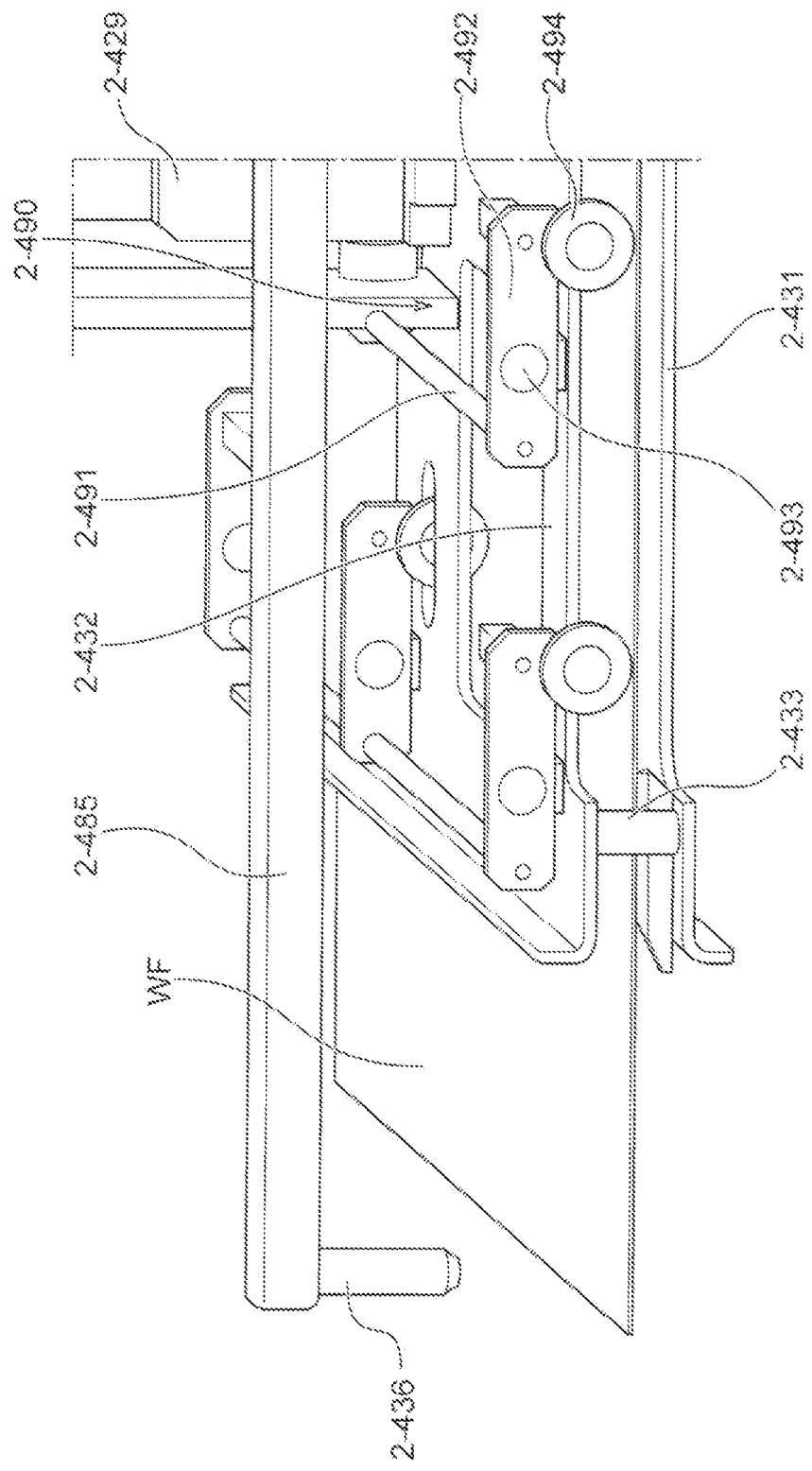
FIG. 25 is a perspective view illustrating the state where the guide roller of the transfer machine is brought into contact with the substrate.
Figure 26:
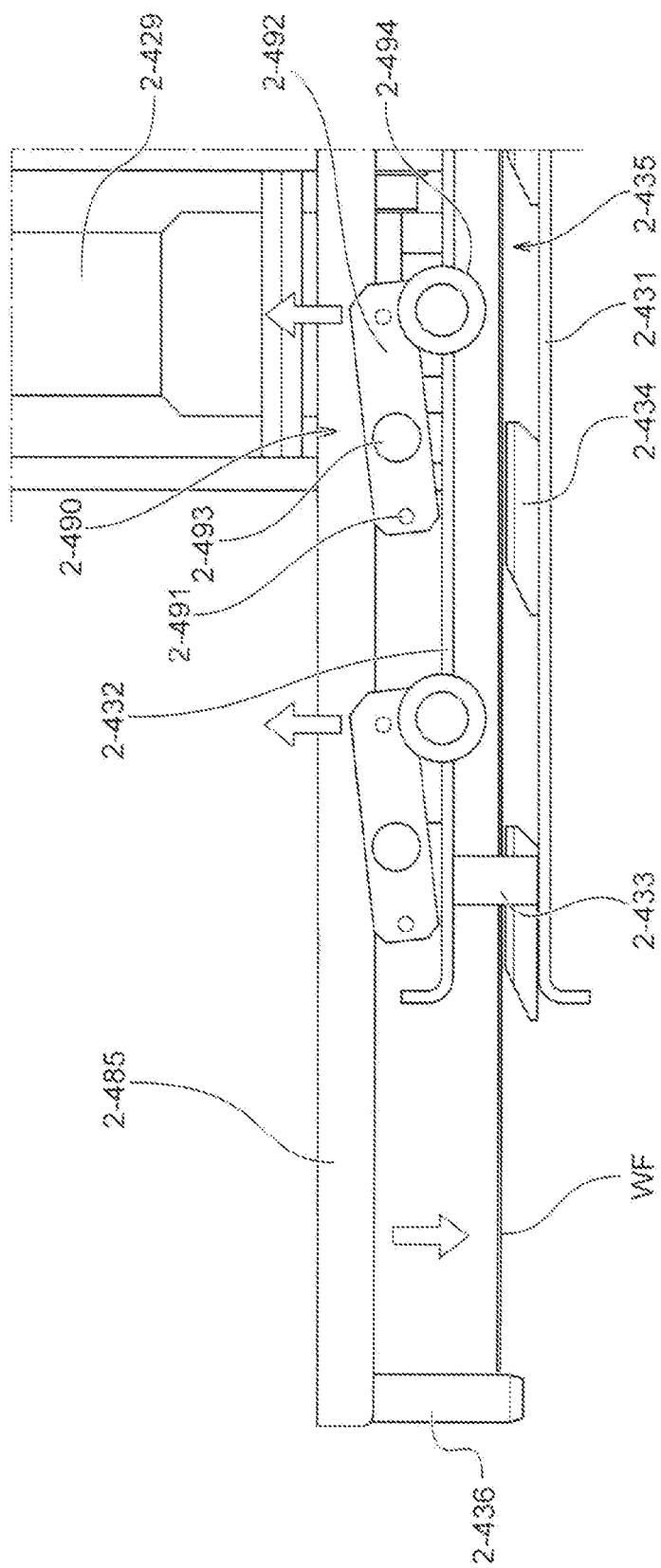
FIG. 26 is a side view illustrating a state where the guide roller of the transfer machine is separated from the substrate.
Figure 27:
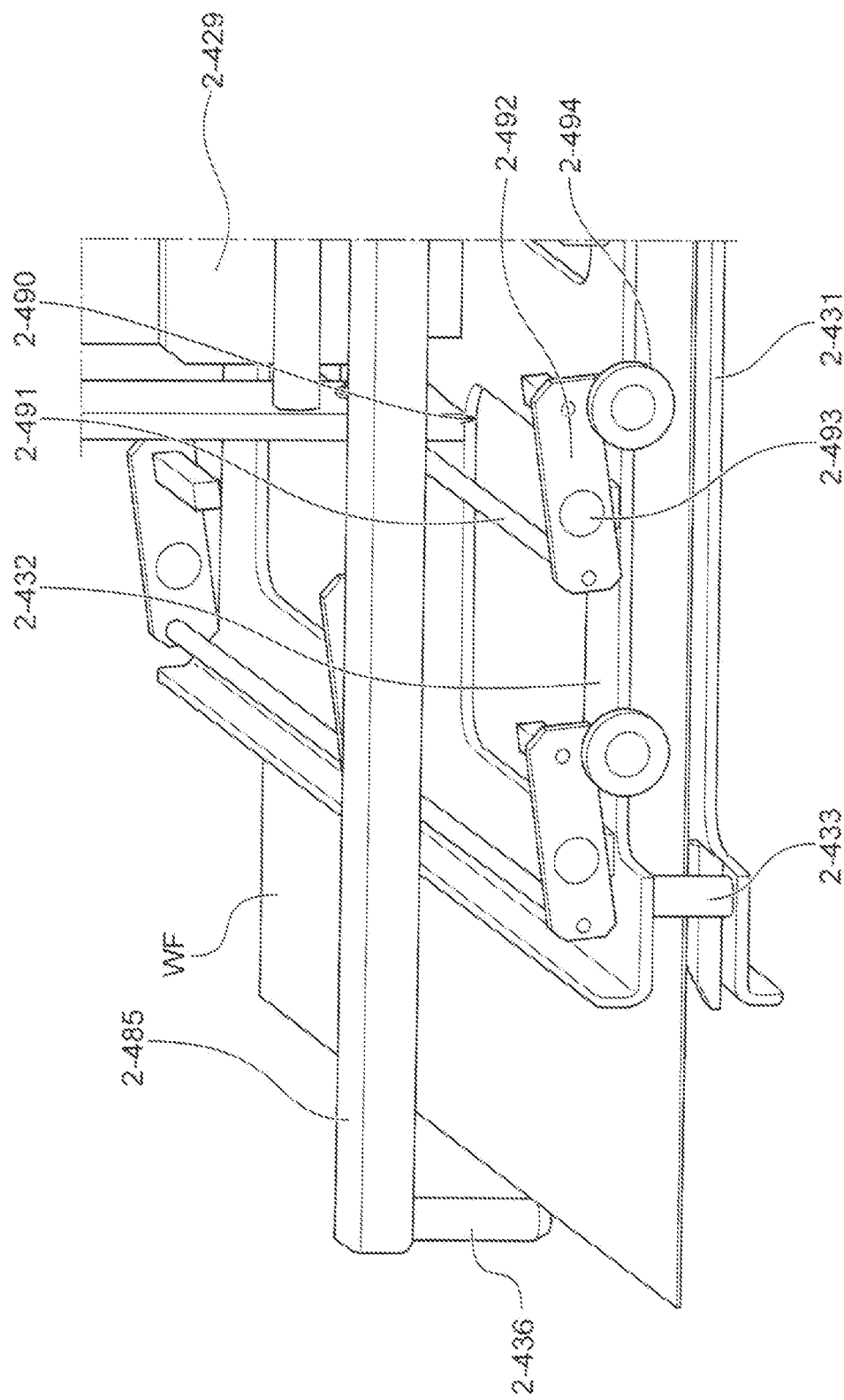
FIG. 27 is a perspective view illustrating the state where the guide roller of the transfer machine is separated from the substrate.

Next, a separation operation of the guide roller 2-494 by the guide release mechanism 2-490 will be described. FIG. 23A to FIG. 23D are diagrams schematically illustrating a flow up to when the substrate is housed in the transfer machine and is lifted up. FIG. 24 is a side view illustrating a state where the guide rollers in the transfer machine are brought into contact with the substrate. FIG. 25 is a perspective view illustrating a state where the guide rollers in the transfer machine are brought into contact with the substrate. FIG. 26 is a side view illustrating a state where the guide rollers in the transfer machine are separated from the substrate. FIG. 27 is a perspective view illustrating a state where the guide rollers in the transfer machine are separated from the substrate.

Figure 23:
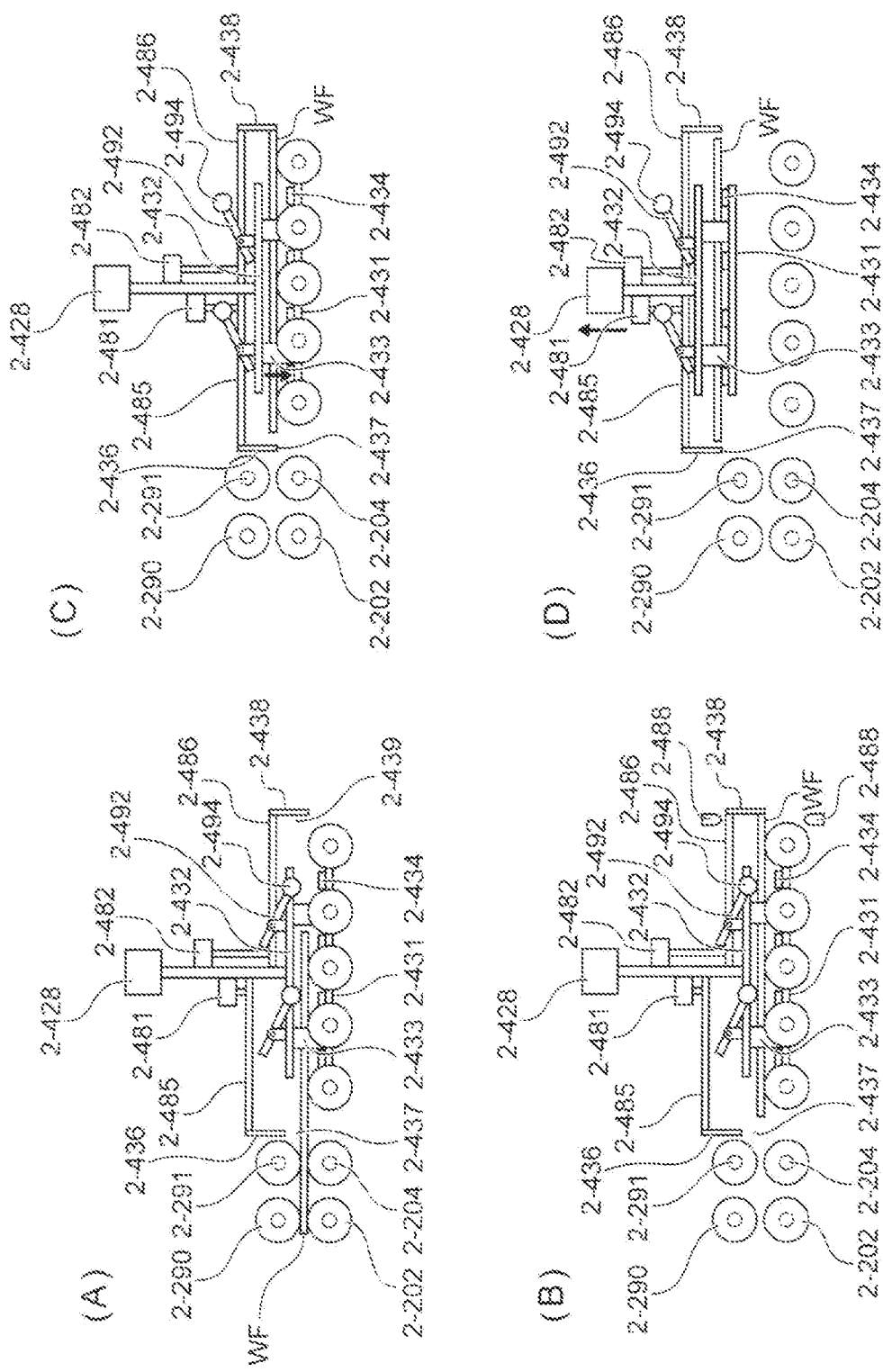
FIG. 23A to FIG. 23D are diagrams schematically illustrating a flow from housing the substrate in the transfer machine to lifting up the substrate.

As illustrated in FIG. 23A, when the substrate WF is being loaded into the housing space 2-435 of the transfer machine 2-420, the transfer machine 2-420 lowers the opening/closing member 2-486 by the outlet lifting mechanism 2-482 and closes the outlet 2-439 of the housing mechanism 2-430 by the outlet shutter 2-438. At this time, as illustrated in FIG. 23A, FIG. 24, and FIG. 25, the transfer machine 2-420 has lifted up the opening/closing member 2-485 by the inlet lifting mechanism 2-481, and this causes the inlet shutter 2-436 to wait on the upper side to open the inlet 2-437. In this state, since the three shafts 2-491 are not pressed by the opening/closing member 2-485, the guide rollers 2-494 are brought into contact with the upper surface of the substrate WF by transferring the substrate into the housing space by the transfer rollers 2-202.

As illustrated in FIG. 23B, when the substrate WF is transferred so as to be brought into contact with the outlet shutter 2-438 and the presence of the substrate WF inside the housing mechanism 2-430 is detected by a sensor 2-488, the rotation of the transfer rollers 2-202 is stopped. Subsequently, as illustrated in FIG. 23C, FIG. 26, and FIG. 27, the transfer machine 2-420 lowers the opening/closing member 2-485 by the inlet lifting mechanism 2-481. This lowers the inlet shutter 2-436 to close the inlet 2-437. By closing the inlet 2-437 and the outlet 2-439 of the housing mechanism 2-430, it is possible to prevent the substrate WF from dropping out of the housing mechanism 2-430 when the substrate WF is transferred to the ultrasonic cleaning tank 2-440 and cleaned in the ultrasonic cleaning tank 2-440.

By lowering the opening/closing member 2-485 to close the inlet 2-437, the transfer machine 2-420 causes the opening/closing member 2-485 to be brought into contact with the three shafts 2-491 to press down the three shafts 2-491. This rotates the link 2-492 counterclockwise about the rotation shafts 2-493 to separate the guide rollers 2-494 from the upper surface of the substrate WF. The transfer machine 2-420 lifts up the substrate WF as illustrated in FIG. 23D in a state where the guide rollers 2-494 are separated from the upper surface of the substrate WF. Then, the substrate WF guided in the housing space 2-435 is lifted up while being supported by the pads 2-434 disposed on the supporting member 2-431. Subsequently, the transfer machine 2-420 carries the substrate WF to the ultrasonic cleaning tank 2-440 and immerses the substrate WF into the ultrasonic cleaning tank 2-440 together with the housing mechanism 2-430 to ultrasonically clean the substrate WF. According to this embodiment, since the guide rollers 2-494 are not brought into contact with the upper surface of the substrate WF, the whole upper surface of the substrate WF can be irradiated with the ultrasonic waves, and, as a result, the generation of the left-uncleaned part of the substrate WF can be suppressed. While, in the above-describe embodiment, the example in which one inlet shutter 2-436 is disposed, two outlet shutters 2-438 are disposed, and the inlet shutter 2-436 and the outlet shutters 2-438 have cylindrical shapes has been described, there are no restrictions on the number and the shape as long as ultrasonic cleaning action is not interfered and dropping off of and damage to the substrate are suppressed. Since the column members 2-433 with which the sides of the substrate WF can be brought into contact are disposed in the direction of and the perpendicular direction of the transfer passage 2-405 in the housing mechanism 2-430, it is possible to achieve both stable transfer and cleaning processing of the substrate WF by disposing guides on all four sides of the substrate WF. Furthermore, by disposing column-shaped guides (side rollers) for guiding the sides of the substrate WF near the column members 2-433, it is possible to more stably transfer the substrate WF.

In the above-described embodiment, while the example in which the inlet shutter 2-436 and the outlet shutter 2-438 are separately lifted up and lowered has been described, the present invention is not limited to this embodiment. FIG. 28A to FIG. 28D are diagrams schematically illustrating a flow of housing a substrate in a transfer machine and lifting up the substrate of a modification. Since in comparison with the above-described transfer machine, the transfer machine of the modification illustrated in FIG. 28A to FIG. 28D differs in that the inlet shutter 2-436 and the outlet shutter 2-438 are simultaneously lifted up and lowered, and that a stopper 2-487 is disposed, and the other configurations are similar to those of the above-described transfer machine, descriptions regarding the similar configurations will be omitted.

As illustrated in FIG. 28A to FIG. 28D, in the transfer machine of the modification, the inlet shutter 2-436 is mounted to the end on the substrate transfer inlet side of the opening/closing member 2-485, and the outlet shutter 2-438 is mounted to the end on the substrate transfer outlet side of the opening/closing member 2-485. This simultaneously lifts up or lowers the inlet shutter 2-436 and the outlet shutter 2-438 by lifting up or lowering the opening/closing member 2-485 by the inlet lifting mechanism 2-481. As illustrated in FIG. 28A to FIG. 28D, the transfer machine of the modification includes the stopper 2-487. The stopper 2-487 is connected to a stopper moving mechanism 2-489. The stopper 2-487 can enter the inside of the transfer passage of the substrate WF at the outlet 2-439. When the stopper 2-487 is positioned inside the transfer passage of the substrate WF, the side surface of the substrate WF moving on the transfer rollers 2-202 is brought into contact with the stopper 2-487, and the substrate WF during movement can be stopped at the position of the stopper 2-487.

Figure 28:
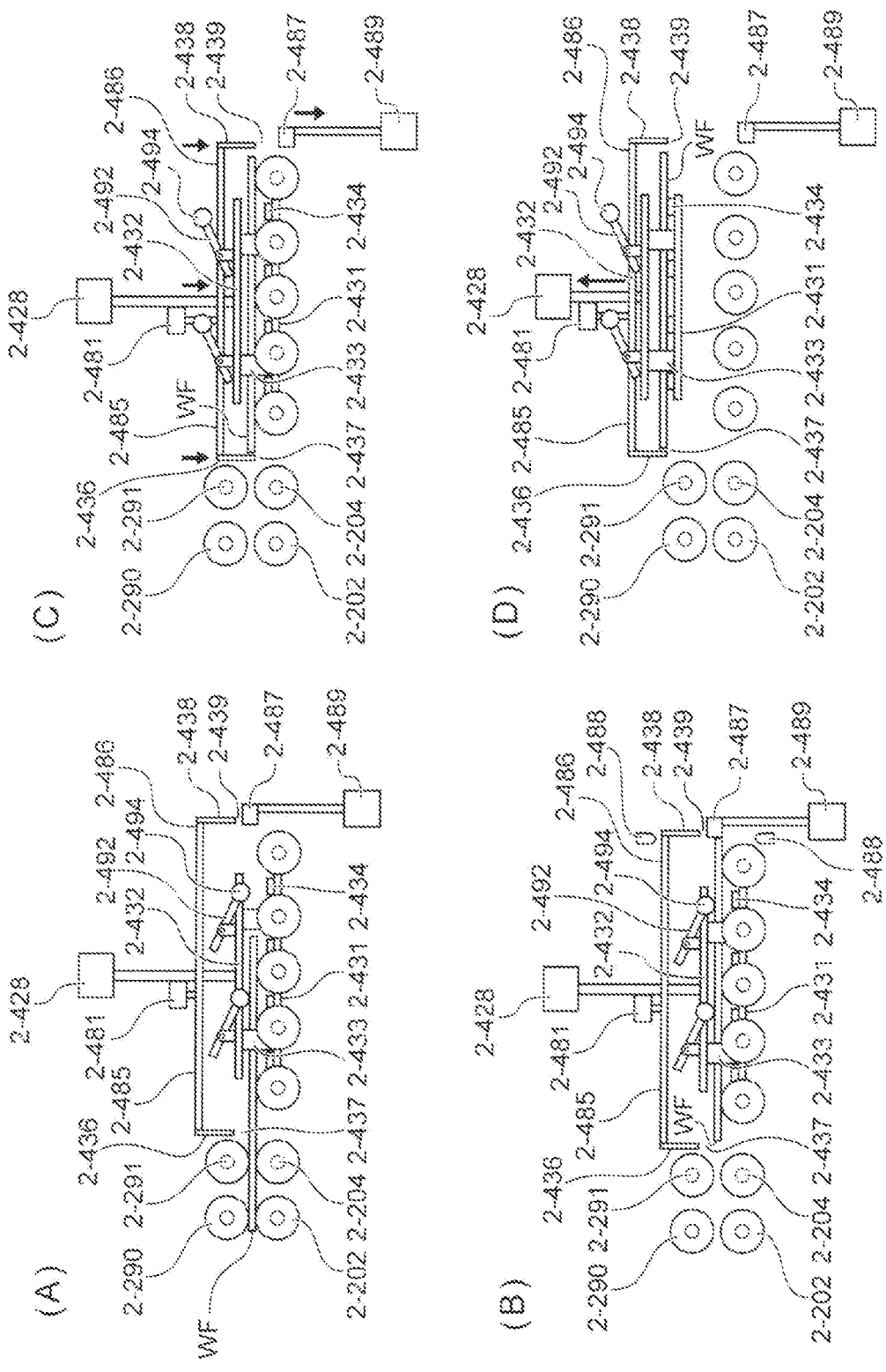
FIG. 28A to FIG. 28D are diagrams schematically illustrating a flow from housing a substrate in a transfer machine of a modification to lifting up the substrate.

As illustrated in FIG. 28A, when the substrate WF is loaded into the transfer machine, the transfer machine is configured to lift up the opening/closing member 2-485 by the inlet lifting mechanism 2-481 to cause the inlet shutter 2-436 and the outlet shutter 2-438 to wait on an upper side and open the inlet 2-437 and the outlet 2-439. On the other hand, the transfer machine closes the outlet 2-439 by causing the stopper 2-487 to enter the transfer passage of the outlet 2-439 by the stopper moving mechanism 2-489. As illustrated in FIG. 28B, with this, the substrate WF is brought into contact with the stopper 2-487 and stops at the grip or release position by stopping the rotation of the transfer rollers 2-202.

Subsequently, as illustrated in FIG. 28C, the transfer machine retreats the stopper 2-487 from the transfer passage by the stopper moving mechanism 2-489 and lowers the opening/closing member 2-485 by the inlet lifting mechanism 2-481. With this, similarly to the above-described embodiment, the links 2-492 rotates counterclockwise about the rotation shafts 2-493 to separate the guide rollers 2-494 from the upper surface of the substrate WF. Subsequently, as illustrated in FIG. 28D, the transfer machine lifts up the substrate WF in a state where the guide rollers 2-494 are separated from the upper surface of the substrate WF. According to the modification, since the inlet shutter 2-436 and the outlet shutter 2-438 are lifted up and lowered by one lifting mechanism, the configuration of the transfer machine can be simplified compared with a case where the inlet shutter 2-436 and the outlet shutter 2-438 are individually lifted up and lowered.

<Scrub Cleaning Mechanism>

As illustrated in FIG. 16, the cleaning module 2-400 includes two scrub cleaning mechanisms 2-450A, 2-450B disposed on the substrate transfer downstream side with respect to the grip or release position in the transfer passage 2-405. The scrub cleaning mechanisms 2-450A, 2-450B are each configured to include the roll sponges (not illustrated) that are brought into contact with both surfaces of the substrate WF transferred by the transfer mechanism 2-210 to rotate and to perform the roll cleaning of both surfaces of the substrate WF by the roll sponges.

<Rinse Cleaning Mechanism>

As illustrated in FIG. 16, the cleaning module 2-400 includes a rinse cleaning mechanism 2-460 disposed on the substrate transfer downstream side with respect to the scrub cleaning mechanisms 2-450A, 2-450B in the transfer passage 2-405. The rinse cleaning mechanism 2-460 is configured to perform the rinse cleaning of both surfaces of the substrate WF by supplying the rinse liquid (for example, pure water) to both surfaces of the substrate WF having been cleaned by a scrub cleaning mechanism 2-450. The substrate WF having been cleaned by the rinse cleaning mechanism 2-460 is unloaded from the cleaning module 2-400 through an outlet shutter 2-470 illustrated in FIG. 16. In this embodiment, while the example in which the rinse cleaning by the rinse cleaning mechanism 2-460 is performed after both of the ultrasonic cleaning by the ultrasonic cleaning tank 2-440 and the roll cleaning by the scrub cleaning mechanism 2-450 are performed on the substrate WF has been described, it is not limited to this. Depending on the material of the substrate WF, a type of stain adhering to the substrate WF, or the size of the substrate WF, the rinse cleaning may be performed after only the ultrasonic cleaning has been performed, or the rinse cleaning can be performed by the cleaning module 2-400 after only the roll cleaning has been performed. The ultrasonic cleaning tank 2-440 and the scrub cleaning mechanism 2-450 may include a system that supplies a chemical liquid. This allows achieving the cleaning module 2-400 that can use both of a physical cleaning method and a chemical cleaning method. Furthermore, the cleaning module 2-400 may include a plurality of ultrasonic cleaning tanks 2-440. This allows increasing the types of cleaning liquids that can be used and thus, allows dealing with various kinds of residue adhering to the substrate and improving throughput of the cleaning module 2-400.

<Drying Module>

The drying module 2-500 illustrated in FIG. 12 is a device for drying the substrate WF. In the substrate processing apparatus 2-1000 illustrated in FIG. 12, the drying module 2-500 dries the substrate WF cleaned by the cleaning module 2-400 after the polishing has been performed by the polishing module 2-300. As illustrated in FIG. 12, the drying module 2-500 is disposed downstream of the cleaning module 2-400.

The drying module 2-500 includes nozzles 2-530 for injecting gas toward the substrate WF being transferred on the transfer rollers 2-202. The gas can be, for example, compressed air or nitrogen. By blowing off the water droplets on the substrate WF, which is being transferred, by the drying module 2-500, the substrate WF can be dried.

<Unload Module>

The unload module 2-600 illustrated in FIG. 12 is a module for unloading the substrate WF to the outside of the substrate processing apparatus 2-1000 after the processing of the polishing, the cleaning, and the like has been performed. In the substrate processing apparatus 2-1000 illustrated in FIG. 12, the unload module 2-600 receives the substrate after having been dried by the drying module 2-500. As illustrated in FIG. 12, the unload module 2-600 is disposed downstream of the drying module 2-500. In one embodiment, the unload module 2-600 is configured to comply with Mechanical Equipment Interface Standard (IPC-SMEMA-9851) of Surface Mount Equipment Manufacturers Association (SMEMA).

Several embodiments of the present invention have been described above in order to facilitate understanding of the present invention without limiting the present invention. The present invention can be changed or improved without departing from its gist, and obviously, the equivalents of the present invention are included in the present invention. It is possible to arbitrarily combine or omit respective constituent elements described in the claims and specification in a range in which at least a part of the above-described problems can be solved, or a range in which at least a part of the effects is exhibited.

This application discloses, as one embodiment, a cleaning module that includes a first transfer mechanism, a cleaning tank, a transfer machine, and a second transfer mechanism. The first transfer mechanism is for transferring a substrate with a surface to be polished facing downward up to a substrate grip or release position on a downstream side along a transfer passage. The cleaning tank is disposed at a position spaced apart from the transfer passage. The cleaning tank is for cleaning the substrate with the surface to be polished facing downward. The transfer machine is for transferring the substrate between the substrate grip or release position of the transfer passage and the cleaning tank. The second transfer mechanism is for transferring the substrate transferred to the substrate grip or release position from the cleaning tank by the transfer machine to further downstream along the transfer passage.

This application discloses, as one embodiment, the cleaning module in which the transfer machine includes a housing mechanism forming a housing space for housing the substrate transferred to the substrate grip or release position along the transfer passage. The transfer machine includes an inlet for loading the substrate into the housing space, a first shutter for opening and closing the inlet, an outlet for unloading the substrate from the housing space; and a second shutter for opening and closing the outlet.

This application discloses, as one embodiment, the cleaning module in which the transfer machine includes a lifting mechanism for lifting up and lowering the housing mechanism, a moving mechanism for moving the housing mechanism between the substrate grip or release position and the cleaning tank, and an inclination mechanism for inclining the housing mechanism.

This application discloses, as one embodiment, the cleaning module in which the cleaning tank includes an ultrasonic irradiating device for applying ultrasonic waves on the substrate immersed in a cleaning liquid housed inside the cleaning tank.

This application discloses, as one embodiment, the cleaning module that further includes a scrub cleaning mechanism disposed on a substrate transfer downstream side with respect to the substrate grip or release position in the transfer passage. The scrub cleaning mechanism includes a first roll sponge configured to be brought into contact with the surface to be polished of the substrate transferred by the second transfer mechanism and rotate, and a second roll sponge configured to be brought into contact with a backside surface of the substrate and rotate.

This application discloses, as one embodiment, the cleaning module in which the scrub cleaning mechanism further includes a first cleaning mechanism for cleaning the first roll sponge by being brought into contact with the first roll sponge and a second cleaning mechanism for cleaning the second roll sponge by being brought into contact with the second roll sponge.

This application discloses, as one embodiment, the cleaning module in which the first roll sponge and the second roll sponge are disposed to be opposed to one another across the second transfer mechanism and the first cleaning mechanism and the second cleaning mechanism are disposed not to be opposed to one another across the second transfer mechanism.

This application discloses, as one embodiment, the cleaning module in which in a region in which the scrub cleaning mechanism is disposed, the second transfer mechanism includes a plurality of first roller shafts disposed along the transfer passage, a plurality of second roller shaft disposed to be opposed to the plurality of first roller shafts across the transfer passage, a plurality of first transfer rollers mounted to the plurality of first roller shafts, a plurality of second transfer rollers mounted to the plurality of second roller shafts, and a plurality of pressing mechanisms configured to individually press at least either of the plurality of first transfer rollers and the plurality of second transfer rollers in a direction of the transfer passage corresponding to a transfer position of the substrate.

This application discloses, as one embodiment, the cleaning module that further includes a rinse cleaning mechanism disposed on a substrate transfer downstream side with respect to the scrub cleaning mechanism of the transfer passage. The rinse cleaning mechanism is for supplying a rinse liquid to the surface to be polished and a backside surface of the substrate cleaned by the scrub cleaning mechanism.

This application discloses, as one embodiment, a substrate processing apparatus. The substrate processing apparatus includes a polishing module configured to polish a substrate, the cleaning module according to any one of the above-described configurations to clean the substrate polished by the polishing module, and a drying module configured to dry the substrate cleaned by the cleaning module.

This application discloses, as one embodiment, a transfer machine for transferring a substrate between a grip or release position in a transfer passage of the substrate and a cleaning tank disposed at a position spaced apart from the transfer passage. The transfer machine includes a guide roller configured to be brought into contact with an upper surface of the substrate transferred to the grip or release position and guide the substrate and a guide release mechanism configured to separate the guide roller from the substrate after the substrate has been transferred up to the grip or release position.

This application discloses, as one embodiment, the transfer machine that further includes a housing mechanism forming a housing space for housing the substrate transferred to the grip or release position, a lifting mechanism configured to lift up and lower the housing mechanism, and a moving mechanism configured to move the housing mechanism between the grip or release position and the cleaning tank.

This application discloses, as one embodiment, the transfer machine in which the housing mechanism includes an inlet for loading the substrate into the housing space, an inlet shutter disposed at the inlet and an inlet opening/closing mechanism for opening and closing the inlet by lifting up and lowering the inlet shutter. The guide release mechanism is configured to separate the guide roller from the substrate in conjunction with an operation in which the inlet opening/closing mechanism closes the inlet.

This application discloses, as one embodiment, the transfer machine in which the guide release mechanism includes a link configured to hold the guide roller and a rotation shaft configured to support between a first end to which the guide roller of the link is mounted and a second end on an opposite side thereof. The guide release mechanism is configured to separate the guide roller from the substrate by pressing down the second end of the link in conjunction with an operation in which the inlet opening/closing mechanism lowers the inlet shutter.

This application discloses, as one embodiment, the transfer machine in which a plurality of the guide rollers are disposed along a direction intersecting with a transfer direction of the substrate, the link and the rotation shaft are disposed for each of the plurality of guide rollers, the guide release mechanism further includes a shaft coupling the second ends of the plurality of links disposed for the plurality of guide rollers. The inlet opening/closing mechanism includes an opening/closing member configured to hold the inlet shutter, the opening/closing member being disposed above the shaft configured to press the shaft and an inlet lifting mechanism for lifting up and lowering the opening/closing member.

This application discloses, as one embodiment, the transfer machine in which the plurality of guide rollers and the plurality of guide release mechanisms disposed for the plurality of guide rollers are disposed along the transfer direction of the substrate, and the opening/closing member is configured to extend across a plurality of shafts of the plurality of guide release mechanisms disposed along the transfer direction of the substrate and is disposed configured to press the plurality of shafts.

This application discloses, as one embodiment, the transfer machine in which the guide release mechanism further includes a weight mounted to the link so as to be lowered to a position at which the guide roller is brought into contact with the upper surface of the substrate when the second end of the link is not pressed down.

This application discloses, as one embodiment, the transfer machine in which the housing mechanism further includes an outlet for unloading the substrate from the housing space, an outlet shutter disposed at the outlet, and an outlet lifting mechanism for lifting up and lowering the outlet shutter.

This application discloses, as one embodiment, a cleaning module. The cleaning module includes a transfer mechanism for transferring a substrate with a surface to be polished facing downward along a transfer passage, a cleaning tank disposed at a position spaced apart from the transfer passage for cleaning the substrate with the surface to be polished facing downward, and any one of the above-described transfer machines for transferring the substrate between a grip or release position in the transfer passage and the cleaning tank.

This application discloses, as one embodiment, the cleaning module in which the cleaning tank includes an ultrasonic irradiating device for applying ultrasonic waves on the substrate immersed in a cleaning liquid housed inside the cleaning tank.

This application discloses, as one embodiment, a substrate processing apparatus. The substrate processing apparatus includes a polishing module configured to polish a substrate, the above-described cleaning module configured to clean the substrate polished by the polishing module, and a drying module configured to dry the substrate cleaned by the cleaning module.

REFERENCE SIGNS LIST

202 . . . transfer roller
204 . . . roller shaft
210-1 . . . first transfer mechanism
210-2 . . . second transfer mechanism
211 . . . pressing mechanism
290 . . . upper transfer roller
291 . . . upper roller shaft
400 . . . cleaning module
405 . . . transfer passage
420 . . . transfer machine
422 . . . transfer shaft
424 . . . moving mechanism
426 . . . inclination mechanism
428 . . . lifting mechanism
430 . . . housing mechanism
435 . . . housing space
436 . . . first shutter
437 . . . inlet
438 . . . second shutter
439 . . . outlet
440 . . . ultrasonic cleaning tank
442 . . . ultrasonic irradiating device
450 . . . scrub cleaning mechanism
451-1 . . . first roll sponge
451-2 . . . second roll sponge
458-1 . . . first cleaning mechanism
458-2 . . . second cleaning mechanism
460 . . . rinse cleaning mechanism
500 . . . drying module
1000 . . . substrate processing apparatus
2-210 . . . transfer mechanism
2-300 . . . polishing module
2-400 . . . cleaning module
2-405 . . . transfer passage
2-418 . . . grip or release position
2-420 . . . transfer machine
2-424 . . . moving mechanism
2-426 . . . inclination mechanism
2-428 . . . lifting mechanism
2-430 . . . housing mechanism
2-431 . . . supporting member
2-432 . . . upper member
2-433 . . . column member
2-435 . . . housing space
2-436 . . . inlet shutter
2-437 . . . inlet
2-438 . . . outlet shutter
2-439 . . . outlet
2-440 . . . ultrasonic cleaning tank
2-480 . . . inlet opening/closing mechanism
2-481 . . . inlet lifting mechanism
2-485 . . . opening/closing member
2-490 . . . guide release mechanism
2-491 . . . shaft
2-492 . . . link
2-492a . . . first end
2-492b . . . second end
2-493 . . . rotation shaft
2-494 . . . guide roller
2-495 . . . weight
2-500 . . . drying module
2-1000 . . . substrate processing apparatus
WF . . . substrate

The invention claimed is:

1. A cleaning module comprising:
a first transfer mechanism for transferring a substrate with a surface to be polished facing downward up to a substrate grip or release position on a downstream side along a transfer passage;
a cleaning tank disposed at a position spaced apart from the transfer passage, the cleaning tank being for cleaning the substrate with the surface to be polished facing downward;
a transfer machine for transferring the substrate between the substrate grip or release position of the transfer passage and the cleaning tank; and
a second transfer mechanism for transferring the substrate transferred to the substrate grip or release position from the cleaning tank by the transfer machine to further downstream along the transfer passage.

2. The cleaning module according to claim 1, wherein the transfer machine includes a housing mechanism forming a housing space for housing the substrate transferred to the substrate grip or release position along the transfer passage, and the transfer machine includes:
- an inlet for loading the substrate into the housing space;
- a first shutter for opening and closing the inlet;
- an outlet for unloading the substrate from the housing space; and
- a second shutter for opening and closing the outlet.

3. The cleaning module according to claim 2, wherein the transfer machine includes:
- a lifting mechanism for lifting up and lowering the housing mechanism;
- a moving mechanism for moving the housing mechanism between the substrate grip or release position and the cleaning tank; and
- an inclination mechanism for inclining the housing mechanism.

4. The cleaning module according to claim 1, wherein the cleaning tank includes an ultrasonic irradiating device for applying ultrasonic waves on the substrate immersed in a cleaning liquid housed inside the cleaning tank.

5. The cleaning module according to claim 1, further comprising
a scrub cleaning mechanism disposed on a substrate transfer downstream side with respect to the substrate grip or release position in the transfer passage, wherein the scrub cleaning mechanism includes:
- a first roll sponge configured to be brought into contact with the surface to be polished of the substrate transferred by the second transfer mechanism and rotate; and
- a second roll sponge configured to be brought into contact with a backside surface of the substrate and rotate.

6. The cleaning module according to claim 5, wherein the scrub cleaning mechanism further includes:
- a first cleaning mechanism for cleaning the first roll sponge by being brought into contact with the first roll sponge; and
- a second cleaning mechanism for cleaning the second roll sponge by being brought into contact with the second roll sponge.

7. The cleaning module according to claim 6, wherein
the first roll sponge and the second roll sponge are disposed to be opposed to one another across the second transfer mechanism, and
the first cleaning mechanism and the second cleaning mechanism are disposed not to be opposed to one another across the second transfer mechanism.

8. The cleaning module according to claim 5, wherein
in a region in which the scrub cleaning mechanism is disposed, the second transfer mechanism includes:
- a plurality of first roller shafts disposed along the transfer passage;
- a plurality of second roller shaft disposed to be opposed to the plurality of first roller shafts across the transfer passage;
- a plurality of first transfer rollers mounted to the plurality of first roller shafts;
- a plurality of second transfer rollers mounted to the plurality of second roller shafts; and
- a plurality of pressing mechanisms configured to individually press at least either of the plurality of first transfer rollers and the plurality of second transfer rollers in a direction of the transfer passage corresponding to a transfer position of the substrate.

9. The cleaning module according to claim 5, further comprising
a rinse cleaning mechanism disposed on a substrate transfer downstream side with respect to the scrub cleaning mechanism of the transfer passage, the rinse cleaning mechanism being for supplying a rinse liquid to the surface to be polished and a backside surface of the substrate cleaned by the scrub cleaning mechanism.

10. A substrate processing apparatus comprising:
a polishing module configured to polish a substrate;
the cleaning module according to claim 1 configured to clean the substrate polished by the polishing module; and
a drying module configured to dry the substrate cleaned by the cleaning module.

* * * * *